United States Patent
Hirosawa

(10) Patent No.: US 11,927,845 B2
(45) Date of Patent: Mar. 12, 2024

(54) DISPLAY DEVICE

(71) Applicant: Japan Display Inc., Tokyo (JP)

(72) Inventor: Jin Hirosawa, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 0 days.

(21) Appl. No.: 18/448,185

(22) Filed: Aug. 11, 2023

(65) Prior Publication Data

US 2023/0384633 A1    Nov. 30, 2023

Related U.S. Application Data

(63) Continuation of application No. PCT/JP2021/044325, filed on Dec. 2, 2021.

(30) Foreign Application Priority Data

Feb. 12, 2021   (JP) ................ 2021-020758

(51) Int. Cl.
*G02F 1/1335*       (2006.01)
*G02F 1/1333*       (2006.01)

(52) U.S. Cl.
CPC .... *G02F 1/133514* (2013.01); *G02F 1/13338* (2013.01); *G02F 1/133512* (2013.01); *G02F 1/133345* (2013.01)

(58) Field of Classification Search
CPC ............. G02F 1/1333; G02F 1/133345; G02F 1/13338; G02F 1/1335; G02F 1/133514; G02F 1/133512; H01L 31/12
See application file for complete search history.

(56) References Cited

U.S. PATENT DOCUMENTS

| | | |
|---|---|---|
| 2003/0174870 A1 | 9/2003 | Kim et al. |
| 2006/0109222 A1 | 5/2006 | Lee et al. |
| 2008/0297709 A1 | 12/2008 | Eguchi |
| 2011/0153284 A1 | 6/2011 | Li et al. |
| 2012/0242636 A1 | 9/2012 | Yuki et al. |
| 2018/0165497 A1 | 6/2018 | Lee et al. |

FOREIGN PATENT DOCUMENTS

| | | |
|---|---|---|
| CN | 110286514 A | 9/2019 |
| CN | 110309775 A | 10/2019 |
| JP | 2006-154815 A | 6/2006 |

(Continued)

OTHER PUBLICATIONS

International Search Report and Written Opinion dated Mar. 1, 2022, received for PCT Application PCT/JP2021/044325, filed on Dec. 12, 2021, 21 pages including English Translation.

*Primary Examiner* — Thoi V Duong
(74) *Attorney, Agent, or Firm* — XSENSUS LLP

(57) ABSTRACT

According to one embodiment, a display device including a second substrate including, a frame-like first light shielding member having a first opening overlapping an optical sensor, a transparent organic insulating layer covering the first light shielding member, a light shielding layer having a second opening overlapping the first opening, a first pixel opening, a second pixel opening, the first light shielding member includes first and second outer edges extending in a first direction, the first outer edge overlaps with the light shielding layer between the second opening and the first pixel opening, and the second outer edge overlaps with the light shielding layer between the second opening and the second pixel opening.

17 Claims, 19 Drawing Sheets

(56) References Cited

FOREIGN PATENT DOCUMENTS

| | | |
|---|---|---|
| JP | 3840595 B2 | 11/2006 |
| JP | 2008-298815 A | 12/2008 |
| JP | 2011-128624 A | 6/2011 |
| JP | 2016-530590 A | 9/2016 |
| JP | 6479151 B2 | 3/2019 |
| WO | 2011/071038 A1 | 6/2011 |
| WO | 2014/197243 A2 | 12/2014 |

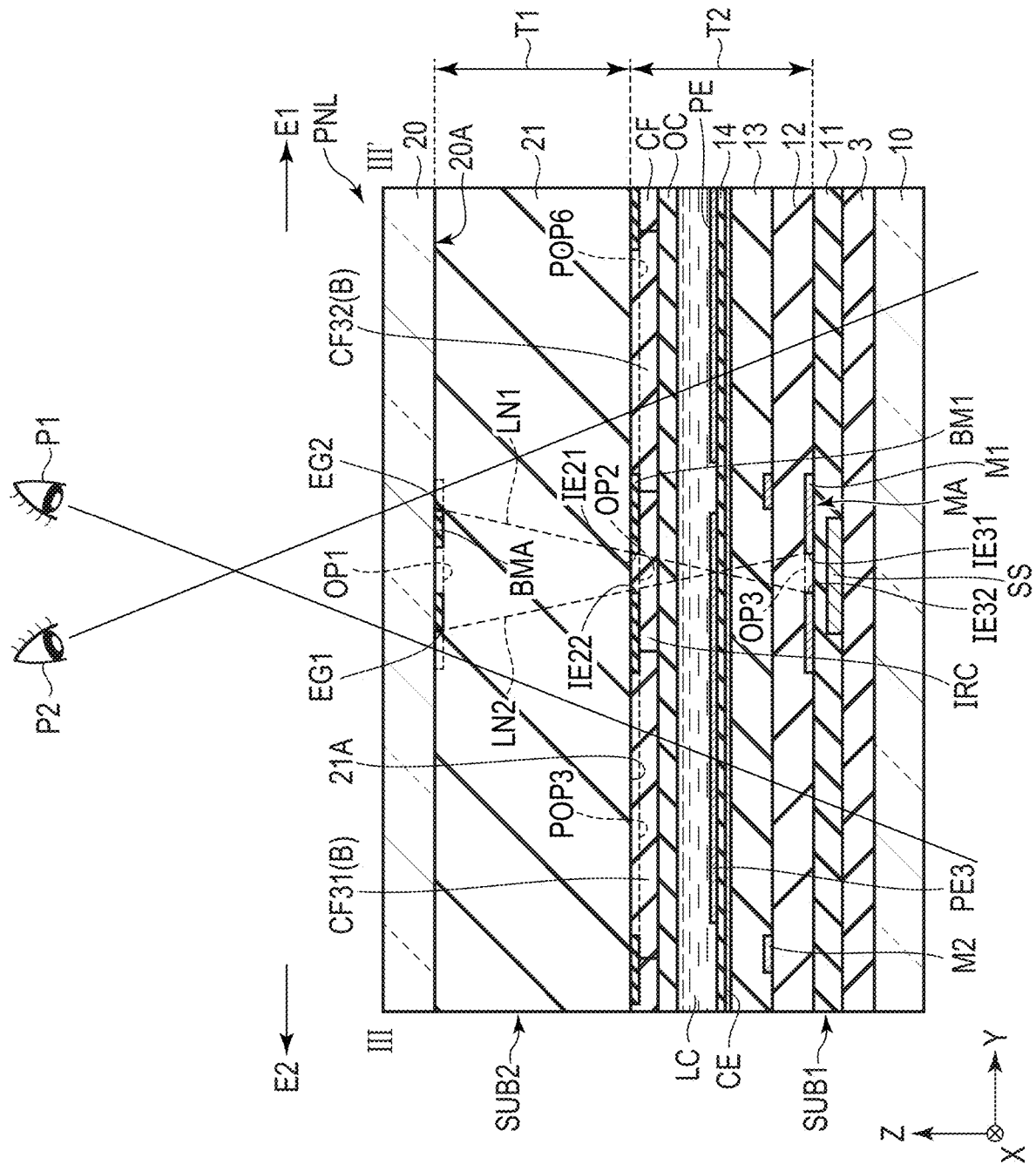
F I G. 5

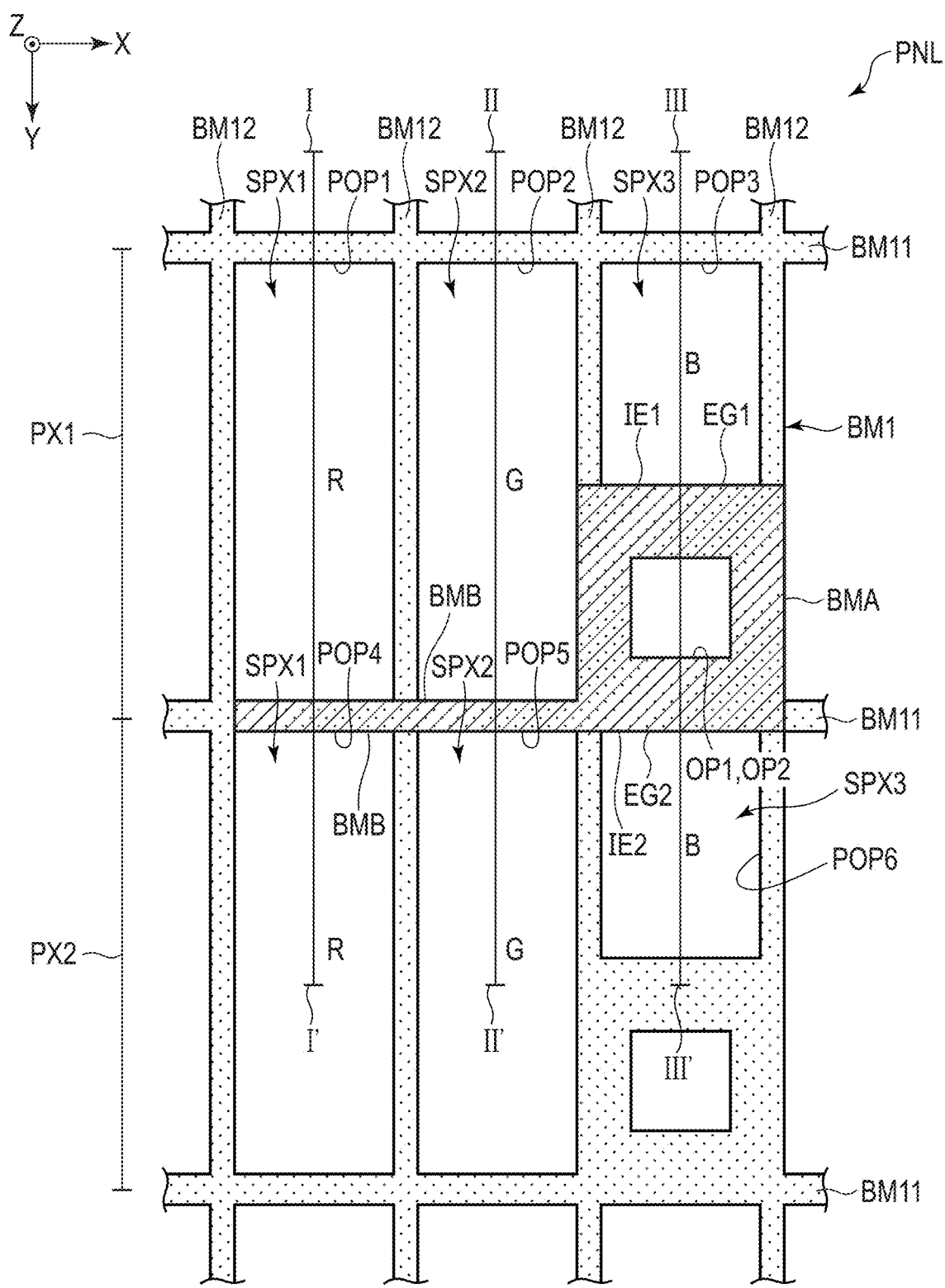
F I G. 10

DISPLAY DEVICE

CROSS-REFERENCE TO RELATED APPLICATIONS

This application is a Continuation Application of PCT Application No. PCT/JP2021/044325, filed Dec. 2, 2021 and based upon and claiming the benefit of priority from Japanese Patent Application No. 2021-020758, filed Feb. 12, 2021, the entire contents of all of which are incorporated herein by reference.

FIELD

Embodiments described herein relate generally to a display device.

BACKGROUND

In recent years, liquid crystal devices with a biometric censor which detects biometric information, such as a fingerprint sensor and a vein sensor are developed. An optical sensor using photoelectric conversion elements is applicable to the biometric sensor, for example. A light shielding layer as a collimator which cuts diagonal incident light is disposed on an upper layer of the optical sensor in order to suppress a decrease in modulation transfer function (MTF) of the optical sensor. However, such a light shielding layer cuts light diagonally passing through pixels positioned in the periphery of the optical sensor, and thus, brightness in a diagonal field of view may be decreased, and undesirable coloring in the display light in a diagonal field of view may occur.

BRIEF DESCRIPTION OF THE DRAWINGS

FIG. 5 is a cross-sectional view of the display panel of FIG. 3, taken along line III-III'.

FIG. 10 is a plan view illustrating the first light shielding member, second light shielding member, and light shielding layer arranged in a pixel.

DETAILED DESCRIPTION

Figure 1:
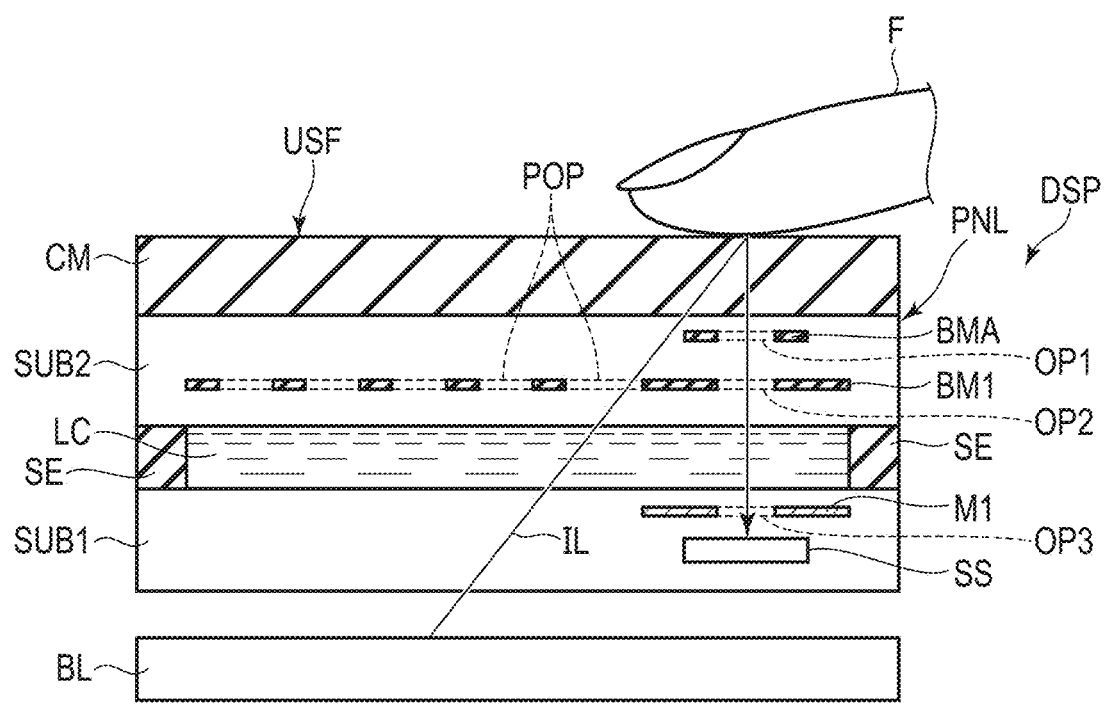
FIG. 1 is a schematic view of a display device of the present embodiment.

In general, according to one embodiment, a display device comprising, a first substrate with an optical sensor, a second substrate opposed to the first substrate, and a liquid crystal layer located between the first substrate and the second substrate, wherein the second substrate includes, an insulating substrate, a frame-like first light shielding member located on the liquid crystal layer side from the insulating substrate and having a first opening overlapping the optical sensor, a transparent organic insulating layer covering the first light shielding member, a light shielding layer located on the liquid crystal layer side from the organic insulating layer and having a second opening overlapping the first opening, a first pixel opening, a second pixel opening, and a third pixel opening, a first color filter disposed in the first pixel opening, a second color filter disposed in the second pixel opening, and having the same color as with the first color filter, and a third color filter disposed in the third pixel opening, and having a different color from the first color filter, the first light shielding member includes a first outer edge and a second outer edge extending in a first direction, the first pixel opening, the second opening, and the second pixel opening are aligned in a second direction crossing the first direction, the third pixel opening is aligned with the first pixel opening and the second opening in the first direction, the first outer edge overlaps with the light shielding layer between the second opening and the first pixel opening in a plan view, and the second outer edge overlaps with the light shielding layer between the second opening and the second pixel opening in a plan view.

According to another embodiment, a display device comprising, a first substrate with an optical sensor, a second substrate opposed to the first substrate, and a liquid crystal layer located between the first substrate and the second substrate, wherein the second substrate includes, an insulating substrate, a frame-like first light shielding member located on the liquid crystal layer side from the insulating substrate and having a first opening overlapping the optical sensor, a band-like second light shielding member located on the liquid crystal layer side from the insulating substrate, a transparent organic insulating layer covering the first light shielding member and the second light shielding member, a light shielding layer located on the liquid crystal layer side from the organic insulating layer and having a second opening overlapping the first opening, a first pixel opening, a second pixel opening, a third pixel opening, a fourth pixel opening, a fifth pixel opening, and a sixth pixel opening, a first color filter disposed in the first pixel opening, a second color filter disposed in the second pixel opening, and having the same color as with the first color filter, a third color filter disposed in the third pixel opening and the fourth pixel opening, and having a different color from the first color filter, and a fourth color filter disposed in the fifth pixel opening and the sixth pixel opening, and having a different color from the first color filter and the third color filter, the fifth pixel opening, the third pixel opening, and the first pixel opening are aligned in a first direction, the first pixel opening, the second opening, and the second pixel opening are aligned in a second direction crossing the first direction, the fourth pixel opening is aligned with the third pixel opening in the second direction, the sixth pixel opening is aligned with the fifth pixel opening in the second direction, and the second light shielding member is positioned between the third pixel opening and the fourth pixel opening and between the fifth pixel opening and the sixth pixel opening in a plan view.

According to another embodiment, a display device comprising, a first substrate with a first optical sensor and a second optical sensor, a second substrate opposed to the first substrate, and a liquid crystal layer located between the first substrate and the second substrate, wherein the second substrate includes, an insulating substrate, a first light shielding member located on the liquid crystal layer side from the insulating substrate and having a first opening with a first hole overlapping the first optical sensor and a second hole overlapping the second optical sensor, an transparent organic insulating layer covering the first light shielding member, a light shielding layer located on the liquid crystal layer side from the organic insulating layer and having a second opening with a third hole overlapping the first hole and a fourth hole overlapping the second hole, a first pixel opening, a second pixel opening, and a third pixel opening, a first color filter disposed in the first pixel opening, a second color filter disposed in the second pixel opening, and having the same color as with the first color filter, and a third color filter disposed in the third pixel opening, and having a different color from the first color filter, the third pixel opening is aligned with the first pixel opening and the third hole in a first direction, and the first pixel opening, the third hole, the fourth hole, and the second pixel opening are aligned in a second direction crossing the first direction.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

First Embodiment

Firstly, a structure of a first embodiment will be explained with reference to FIGS. 1 to 6.

FIG. 1 is a schematic view of a display device DSP of the present embodiment. The display device DSP of the present embodiment is a liquid crystal display device.

The display device DSP includes a display panel PNL, cover member CM, and backlight unit BL.

The display panel PNL is a liquid crystal display panel including a first substrate SUB1, second substrate SUB2 opposed to the first substrate SUB1, sealant SE, and liquid crystal layer LC positioned between the first substrate SUB1 and the second substrate SUB2.

The first substrate SUB1 includes an optical sensor SS and a first metal layer M1. The first metal layer M1 is positioned further in the liquid crystal layer LC side than is the optical sensor SS. Furthermore, the second substrate SUB2 includes a first light shielding member BMA and a light shielding layer BM1. The light shielding layer BM1 is positioned further in the liquid crystal layer LC side that is the first light shielding member BMA. The display panel PNL of the present embodiment is a transmissive type with a transmissive display function by which an image is displayed by selectively transmit light from the rear surface side of the first substrate SUB1.

The first light shielding member BMA includes a first opening OP1 overlapping the optical sensor SS. The light shielding layer BM1 includes a second opening OP2 overlapping the optical sensor SS. The first metal layer M1 includes a third opening OP3 overlapping the optical sensor SS. The first opening OP1, second opening OP2, and third opening OP3 are formed in a position to overlap with each other. Furthermore, the light shielding layer BM1 includes a pixel opening POP in a position not overlapping the optical sensor SS.

The sealant SE adheres the first substrate SUB1 and the second substrate SUB2 together. A certain cell gap is formed between the first substrate SUB1 and the second substrate SUB2 through a spacer which is not shown. The liquid crystal layer LC is charged within the cell gap.

The cover member CM is disposed on the display panel PNL. The cover member CM is, for example, a glass substrate or a resin substrate. The cover member CM includes an upper surface USF on which an object such as a living body contacts. The structural example of FIG. 1 indicates a state where a finger F is contacting the upper surface USF.

The backlight unit BL is disposed below the display panel PNL. The backlight unit BL emits illumination light IL to the upper surface USF.

Upon detection of, for example, the illumination light IL reflected by the finger F, the optical sensor SS can detect asperity (fingerprint, for example) on the surface of the finger F. The optical sensor SS is desired to detect incident light parallel to the direction normal to the upper surface USF in order to obtain more accurate signals. The first light shielding member BMA, light shielding layer BM1, and first metal layer M1 function as a collimator paralleling the light incident on the optical sensor SS. That is, the light inclined with respect to the direction normal to the upper surface USF is shut down by the first light shielding member BMA, light shielding layer BM1, and first metal layer M1. For example, the reflection light reflected by the finger F of the illumination light IL passes through the first opening OP1, second opening OP2, and third opening OP3, and is detected by the optical sensor SS. That is, the reflection light reflected by the finger F passes above the cover member CM, second substrate SUB2, liquid crystal layer LC, and optical sensor SS of the first substrate SUB1, and is detected by the optical sensor SS.

With the aforementioned optical sensor SS mounted in the display device DSP, a function of the fingerprint sensor can be applied to the display device DSP. Furthermore, the optical sensor SS detects reflection light reflected inside the finger F, in addition to the fingerprint thereof, and thus, detects information related to the living body. In this example, the information related to the living body includes, for example, images of blood vessels such as veins, pulse, and brain waves.

Figure 2:
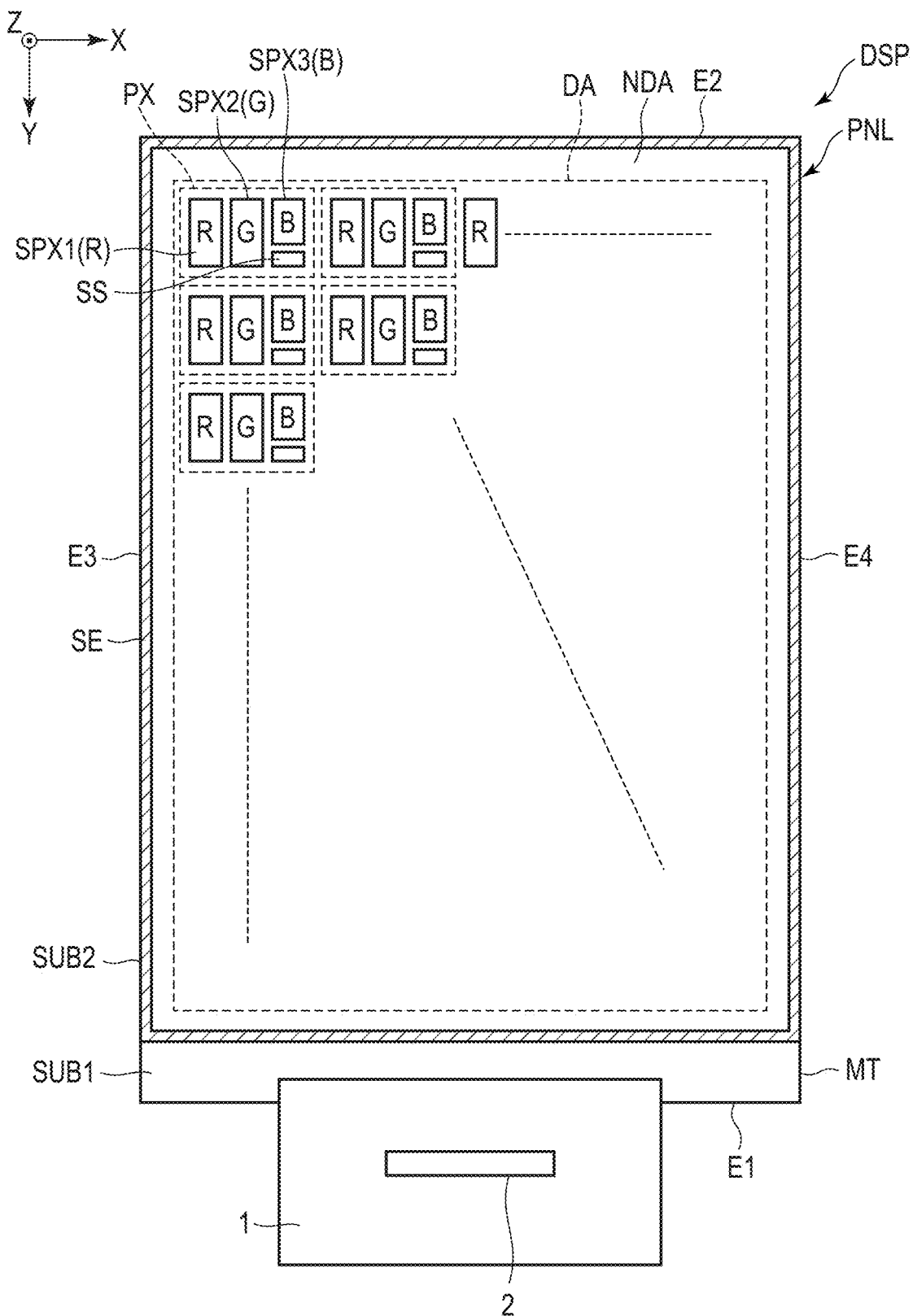
FIG. 2 is a schematic plan view of the display device of the present embodiment.

FIG. 2 is a schematic plan view of the display device DSP of the present embodiment.

In this example, a first direction X, second direction Y, and third direction Z are orthogonal to each other; however, they may cross at angles other than 90 degrees. The first direction X and the second direction Y correspond to a direction parallel to the main surface of the substrates of the display device DSP, and the third direction Z corresponds to a thickness direction of the display device DSP. In the present application, a direction toward the arrow indicative of the third direction Z will be defined as above, and the opposite direction thereof will be defined as below. Furthermore, an observation position to observe the display device DSP is hypothetically set in the tip end of the arrow indicative of the third direction Z, and viewing an X-Y plane defined by the first direction X and the second direction Y from the observation position will be referred to as plan view.

The display device DSP includes the aforementioned display panel PNL and a line substrate 1 mounted on the display panel PNL. The display panel PNL includes a display area DA in which an image is displayed, and a non-display area NDA surrounding the display area DA.

The first substrate SUB1 includes a mount MT which is exposed further outside than is the second substrate SUB2. The sealant SE is positioned in the non-display area NDA. In FIG. 2, the area where the sealant SE is disposed is hatched. The display area DA is positioned inside the area surrounded by the sealant SE. The display panel PNL includes a plurality of pixels PX arranged in a matrix extending in the first direction X and the second direction Y in the display area DA.

A pixel PX is configured with a subpixel SPX1 displaying read (R), subpixel SPX2 displaying green (G), subpixel SPX3 displaying blue (B), and optical sensor SS. In the pixel PX, the subpixel SPX1, subpixel SPX2, and subpixel SPX3 are aligned in the first direction in the order stated. The optical sensor SS is aligned with the subpixel SPX3 in the second direction Y and with the subpixel SPX2 in the first direction X. In the whole display area DA, a plurality of optical sensors SS are arranged in a matrix in the first direction X and the second direction Y. The optical sensor SS is disposed, for example, one per pixel PX.

The display panel PNL is, in the example depicted, formed in a rectangular shape in a plan view. The display panel PNL includes edges E1 and E2 extending in the first direction X and edges E3 and E4 extending in the second direction Y. In the example depicted, the edges E1 and E2 are short sides, and the edges E3 and E4 are long sides.

The line substrate 1 is a flexible substrate, and is mounted on the mount MT. Furthermore, the line substrate 1 includes a driver IC chip 2 which drives the display panel PNL. Note that the driver IC chip 2 may be mounted on the mount MT.

Figure 3:
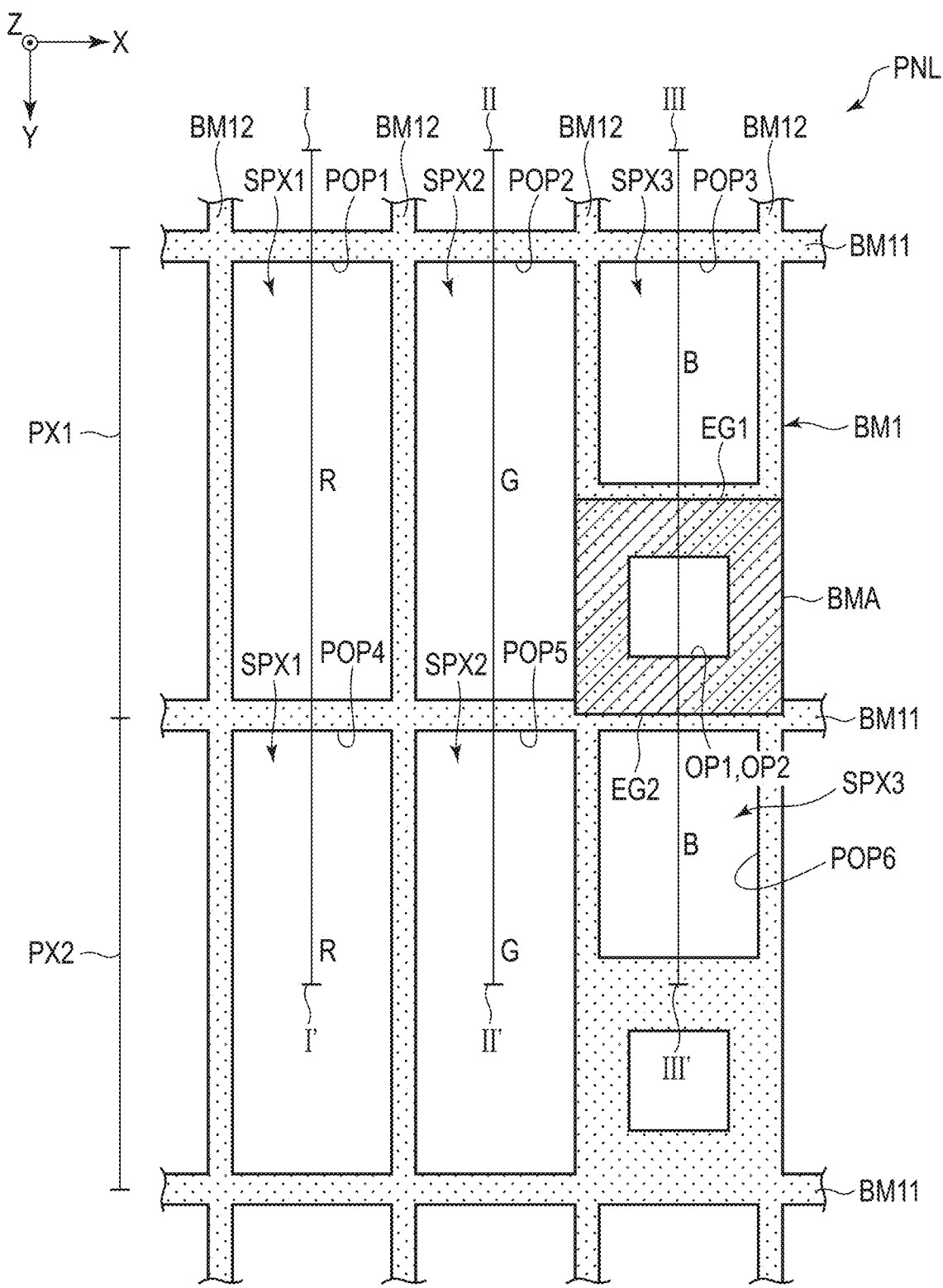
FIG. 3 is a plan view illustrating a first light shielding member and a light shielding layer disposed in pixels.

FIG. 3 is a plan view illustrating the first light shielding member BMA and the light shielding layer BM1 arranged in the pixels PX1 and PX2. In FIG. 3, the area where the first light shielding member BMA is disposed is hatched. Hereinafter, only the first light shielding member BMA arranged in the pixel PX1 will be illustrated, and the depiction of the first light shielding member BMA disposed in the pixel adjacent to the pixel PX1 will be omitted. The same applies to a second light shielding member which will be described later. Note that, the area where the light shielding layer BM1 is disposed is dotted.

The first light shielding member BMA includes a first opening OP1, and is formed in a frame-like shape. The first light shielding member BMA overlaps with the light shielding layer BM1. the light shielding layer BM1 includes a plurality of first parts BM11 extending in the first direction X and aligned in the second direction Y, and a plurality of second parts BM12 extending in the second direction Y and aligned in the first direction X. The light shielding layer BM1 defines subpixels SPX1, SPX2, and SPX3 of each of the pixels PX1 and PX2. Furthermore, the light shielding layer BM1 includes pixel openings POP1, POP2, POP3, POP4, POP5, and POP6, and the second opening OP2. The pixel openings POP1 to POP6 are surrounded by two adjacent first parts BM11 and two adjacent second parts BM12. In the pixel PX1, the pixel opening (fifth pixel opening) POP1, pixel opening (third pixel opening) POP2, and pixel opening (first pixel opening) POP3 are aligned in the first direction X. In the pixel PX2, the pixel opening (sixth pixel opening) POP4, pixel opening (fourth pixel opening) POP5, and pixel opening (second pixel opening) pop6 are aligned in the first direction X. The pixel opening POP4 is applied with the pixel opening POP1 in the second direction Y. The pixel opening POP5 is aligned with the pixel opening POP2 in the second direction Y. The pixel opening POP3, second opening OP2, pixel opening POP6, are aligned in the second direction Y. Furthermore, the pixel opening POP2 is aligned with the pixel opening POP3 and the second opening OP2 in the first direction X. The second opening OP2 is formed in a position overlapping the first opening OP1. Note that, the structure similar to the pixel PX1 is applied to the other pixels PX which are not shown.

Now, the pixel opening POP3 of the pixel PX1, second opening OP2, and pixel opening POP6 of the pixel PX2 are focused. In the second direction Y, the second opening OP2 is positioned between the pixel opening POP3 and the pixel opening POP6. The first light shielding member BMA includes an outer edge (first outer edge) EG1 and an outer edge (second outer edge) EG2 extending in the first direction X. The outer edge EG1 overlaps the light shielding layer BM1 between the second opening OP2 and the pixel opening POP3 in a plan view. The outer edge EG2 overlaps the light shielding layer BM1 between the second opening OP2 and the pixel opening POP6 in a plan view.

Figure 4:
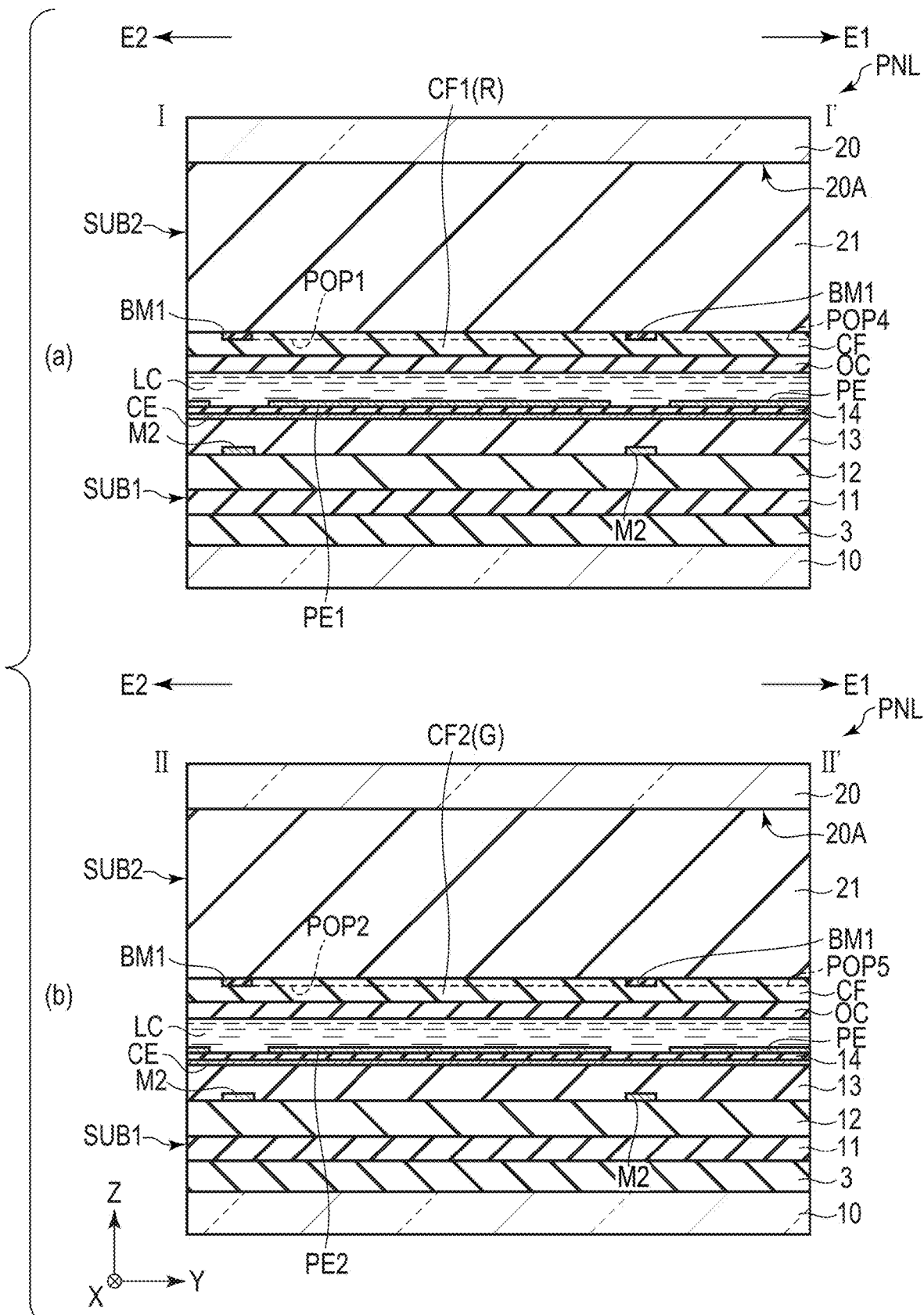
FIG. 4 is a cross-sectional view of a display panel of FIG. 3.

FIG. 4 is a cross-sectional view of the display panel PNL of FIG. 3.

FIG. 4(a) is a cross-sectional view of a display panel PNL of FIG. 3, taken along line I-I'.

The first substrate SUB1 includes, for example, an insulating substrate 10, configuration layer 3, insulating layers 11 to 14, second metal layer M2, common electrode CE, and pixel electrode PE.

The insulating substrate 10 is a transparent substrate such as a glass substrate or a resin substrate. The configuration layer 3 is positioned above the insulating substrate 10. The configuration layer 3 includes a switching element and an insulating layer, for example. The detailed structure of the configuration layer 3 will be explained later with reference to FIG. 17. The insulating layer 11 covers the configuration layer 3. The insulating layer 12 covers the insulating layer 11. The second metal layer is positioned above the insulating layer 12. The insulating layer 13 covers the second metal layer M2 and the insulating layer 12. The common electrode CE is positioned above the insulating layer 13. The insulating layer 14 covers the common electrode CE. The pixel electrode PE is positioned above the insulating layer 14. The pixel electrode PE and the insulating layer 14 are covered with an alignment film which is not shown. Note that, the pixel electrode PE overlapping the pixel opening POP1 will be referred to as pixel electrode PE1.

The second substrate SUB2 includes, for example, an insulating substrate 20, transparent organic insulating layer 21, light shielding layer BM1, color filter layer CF, and overcoat layer OC.

The insulating substrate 20 is a transparent substrate such as a glass substrate or a resin substrate. The insulating substrate 20 includes a surface 20A in the liquid crystal layer LC side. The organic insulating layer 21 is disposed in the insulating substrate 20 in the liquid crystal layer LC side, covering the surface 20A. The light shielding layer BM1 and the color filter layer CF are disposed in the organic insulating layer 21 in the liquid crystal layer C side. The light shielding layer BM1 overlaps the second metal layer M2. The light shielding layer BM1 is formed of, for example, a black resin.

The color filter layer CF includes a color filter (fourth color filter) CF1. The color filter CF1 is disposed in the pixel openings POP1 to POP4. Furthermore, the color filter CF1 overlaps the pixel electrode PE1.

The overcoat layer OC covers the color filter layer CF. The overcoat layer OC is covered with an alignment film which is not shown.

The insulating layers 11 and 14 are formed of a transparent inorganic insulating material such as silicon oxide, silicon nitride, silicon oxynitride. The insulating layers 12, 13, and 21 are formed of a transparent organic insulating material. The pixel electrode PE and the common electrode CE are formed of a transparent conductive material such as indium tin oxide (ITO) or indium zinc oxide (IZO).

FIG. 4(b) is a cross-sectional view of the display panel PNL of FIG. 3, taken along line II-II'.

The color filter layer CF includes a color filter (third color filter) CF2. The color filter CF2 is disposed in the pixel openings POP2 and POP5. Furthermore, the color filter CF2 overlaps the pixel electrode PE2. Color of the color filter CF2 is different from that of the color filter CF1. Note that, the pixel electrode PE overlapping the pixel opening POP2 will be referred to as pixel electrode PE2.

FIG. 5 is a cross-sectional view of the display panel PNL of FIG. 3, taken along line III-III'.

The optical sensor SS is disposed above the configuration layer 3, and is covered with the insulating layer 11. The first metal layer M1 is disposed above the insulating layer 11, and is covered with the insulating layer 12. The second metal layer M2 is positioned between the first metal layer M1 and the liquid crystal layer LC.

The color filter layer CF includes a color filter (first color filter) CF31 and a color filter (second color filter) CF32. The color filter CF31 is disposed in the pixel opening POP3, and the color filter CF32 is disposed in the pixel opening POP6. Furthermore, the color filter CF31 overlaps the pixel electrode PE3. Color of the color filter CF31 is different from those of the aforementioned color filters CF1 and CF2. The color filter CF32 and the color filter Cf31 are the same color. Note that, the pixel electrode PE overlapping the pixel opening POP3 will be referred to as pixel electrode PE3.

The color filter layer CF includes an infrared cut layer IRC overlapping the optical sensor SS. The infrared cut layer IRC is disposed in the second opening OP2. The infrared cut layer IRC cuts infrared which becomes noise with respect to the optical sensor SS when the display device DSP is used under the sun. With the infrared cut layer IRC disposed above the optical sensor SS, potential erroneous operation of the optical sensor SS by optical noise can be suppressed.

Note that, the pixel electrode PE3 overlapping the color filter CF31 overlaps the infrared cut layer IRC as well.

The first light shielding member BMA is disposed in the insulating substrate 20 in the liquid crystal layer LC side. In the example depicted, the first light shielding member BMA is positioned on a surface 20A. The first light shielding member BMA is formed of, for example, a black resin. Edges EG1 and EG2 of the first light shielding member BMA overlap the infrared cut layer IRC. The outer edge EG1 does not overlap the color filter CF31, and the outer edge EG2 does not overlap the color filter CF32. The organic insulating layer 21 covers the first light shielding member BMA. The organic insulating layer 21 is interposed between the first light shielding member BMA and the light shielding layer BM1.

The organic insulating layer 21 has a first thickness T1. The display panel PNL has a second thickness T2 between a lower surface MA of the first metal layer M1 and a lower surface 21A of the organic insulating layer 21. The first thickness T1 is greater than the second thickness T2.

Now, advantages obtainable by the present embodiment will be explained.

Initially, a case where the first light shielding member BMA is formed to a position of dotted lines in the periphery of the first light shielding member BMA of FIG. 5 is hypothetically given. Furthermore, an observation position to diagonally observe the display panel PNL from the edge E1 side of the display panel PNL of FIG. 2 will be an observation point P1, and an observation position to diagonally observe the display panel PNL from the edge E2 side of the display panel PNL will be an observation point P2.

When observing the display panel PNL from the observation point P1, light passing through the color filter CF31 of blue (B) is blocked by the first light shielding member BMA. Thereby, the display light observed at the observation point P1 may be tinted closer to a yellow wavelength, for example. Furthermore, when observing the display panel PNL from the observation point P2, light passing through the color filter CF32 of blue (B) is blocked by the first light shielding member BMA. Thereby, the display light observed at the observation point P2 may be tinted closer to a yellow wavelength, for example.

Especially, when the first thickness T1 of the organic insulating layer 21 becomes greater, the light toward the diagonal field of view is easily blocked by the first light shielding member BMA, and a tint in such a field of view tends to occur.

According to the present embodiment, the outer edge EG1 of the first light shielding member BMA is positioned between the second opening OP2 and the pixel opening POP3, and the outer edge EG2 of the first light shielding member BMA is positioned between the second opening OP2 and the pixel opening POP6. Thus, the light toward the diagonal field of view is not blocked by the first light shielding member BMA, and undesirable tint in the display light can be suppressed. Furthermore, the aforementioned problem can be solved without decreasing the first thickness T1 of the organic insulating layer 21.

Now, positions of the outer edges EG1 and EG2 will be defined in detail.

The first metal layer M1 includes an inner edges IE31 and IE32 facing the third opening OP3. The inner edge IE31 is positioned in the edge E1 side, and the inner edge IE32 is positioned in edge E2 side. Furthermore, the light shielding layer BM1 includes inner edges IE21 and IE22 facing the second opening OP2. The inner edge IE21 is positioned in the edge E1 side, and the inner edge IE22 is positioned in the edge E2 side. The inner edges IE21, IE22, IE31, and IE32 extend in the first direction X (cf. FIG. 6). Given a line LN1 connecting the inner edge IE32 and the inner edge IE21, the outer edge EG2 can be brought as closer to the first opening OP1 as crossing the line LN1. Similarly, given a line LN2 connecting the inner edge IE31 and the inner edge IE22, the outer edge EG1 can be brought as closer to the first opening OP1 as crossing the line LN2. By defining the positions of the outer edges EG1 and EG2 as above, light entering the optical sensor SS from the outside of the first light shielding member BMA can be reduced.

Note that, in the example of FIG. 5, the outer edge EG1 is positioned on the line LN2, and the outer edge EG2 is positioned on the line LN1.

Figure 6:
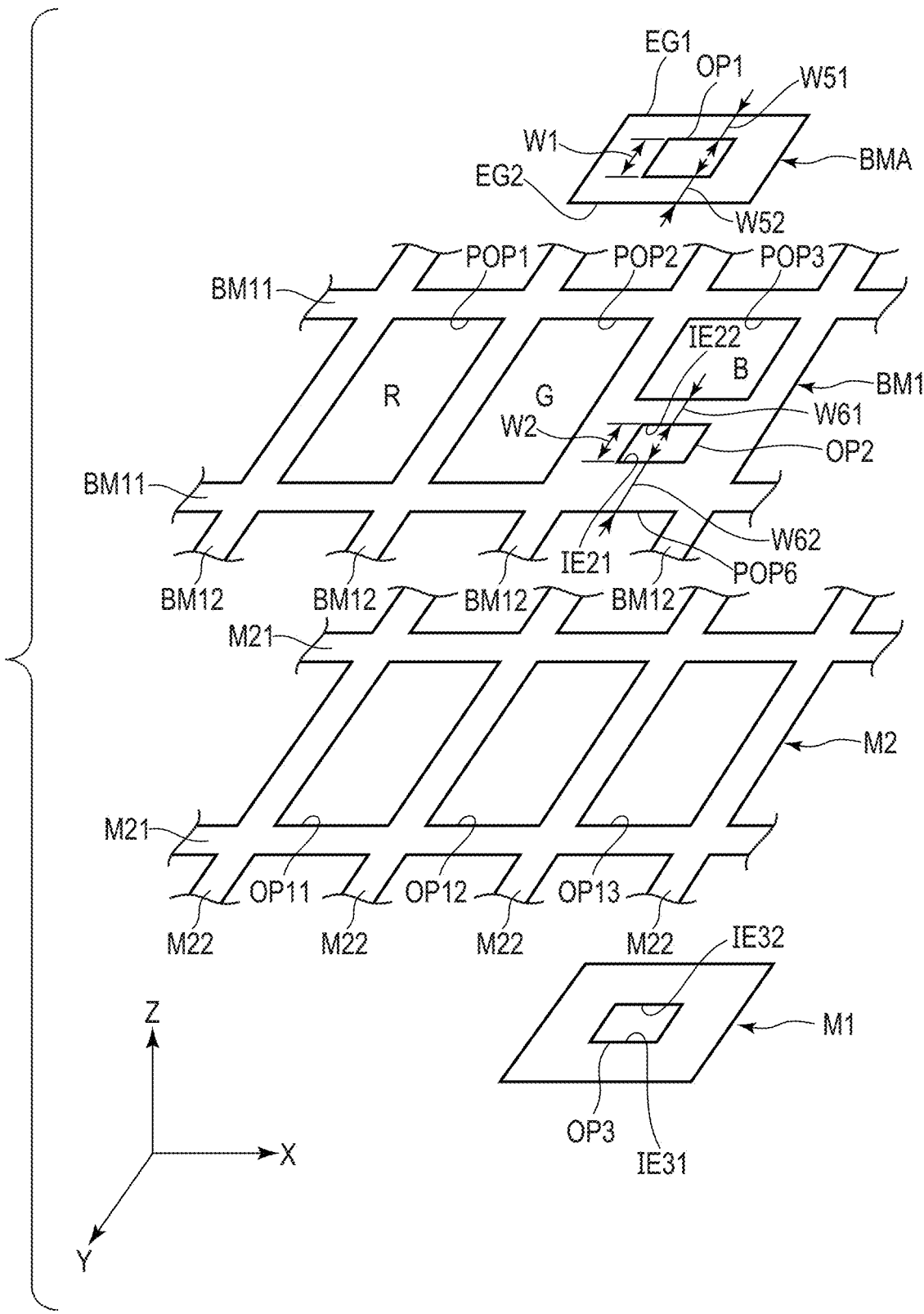
FIG. 6 is a perspective view illustrating a relationship between a first light shielding member, light shielding layer, first metal layer, and second metal layer of a first embodiment.

FIG. 6 is a perspective view illustrating a relationship between the first light shielding member BMA, light shielding layer BM1, first metal layer M1, and second metal layer M2 of the first embodiment.

The first opening OP1 has a width W1 along the second direction Y. The second opening OP2 has a width W2 along the second direction Y. For example, widths W1 and W2 are equal.

The first light shielding member BMA has a width W51 between the first opening OP1 and the outer edge EG1, and a width W52 between the first opening OP1 and the outer edge EG2. The light shielding layer BM1 has a width W61 between the second opening OP2 and the pixel opening POP3, and a width W62 between the second opening OP2 and the pixel opening POP6. The width W51 is less than the width W61. The width W52 is less than the width W62.

The first metal layer M1 is formed in a frame shape. The second metal layer M2 includes a plurality of first parts M21 extending in the first direction X and aligned in the second direction Y, and a plurality of second parts M22 extending in the second direction Y and aligned in the first direction X. The first part M21 overlaps a first part BM1 of the light shielding layer BM1, and the second part M22 overlaps a second part BM12 of the light shielding layer BM1. Furthermore, the metal layer M2 includes a plurality of openings OP11, OP12, and OP13 defined by the first and second parts M21 and M22. The opening OP11 overlaps the pixel opening POP1. The opening OP12 overlaps the pixel opening POP2. The opening (fourth opening) OP13 overlaps the pixel opening POP3 and the second opening OP2. The opening OP13 further overlaps the first opening OP1 of the first light shielding member BMA and the third opening OP3 of the first metal layer M1. The opening OP13 is positioned between the second opening OP2 and the third opening OP3.

Second Embodiment

Now, the structure of the second embodiment will be explained with reference to FIGS. 7 to 9. The second embodiment differs from the first embodiment in respect of the width of the first metal layer M1 in the second direction Y being small.

Figure 7:
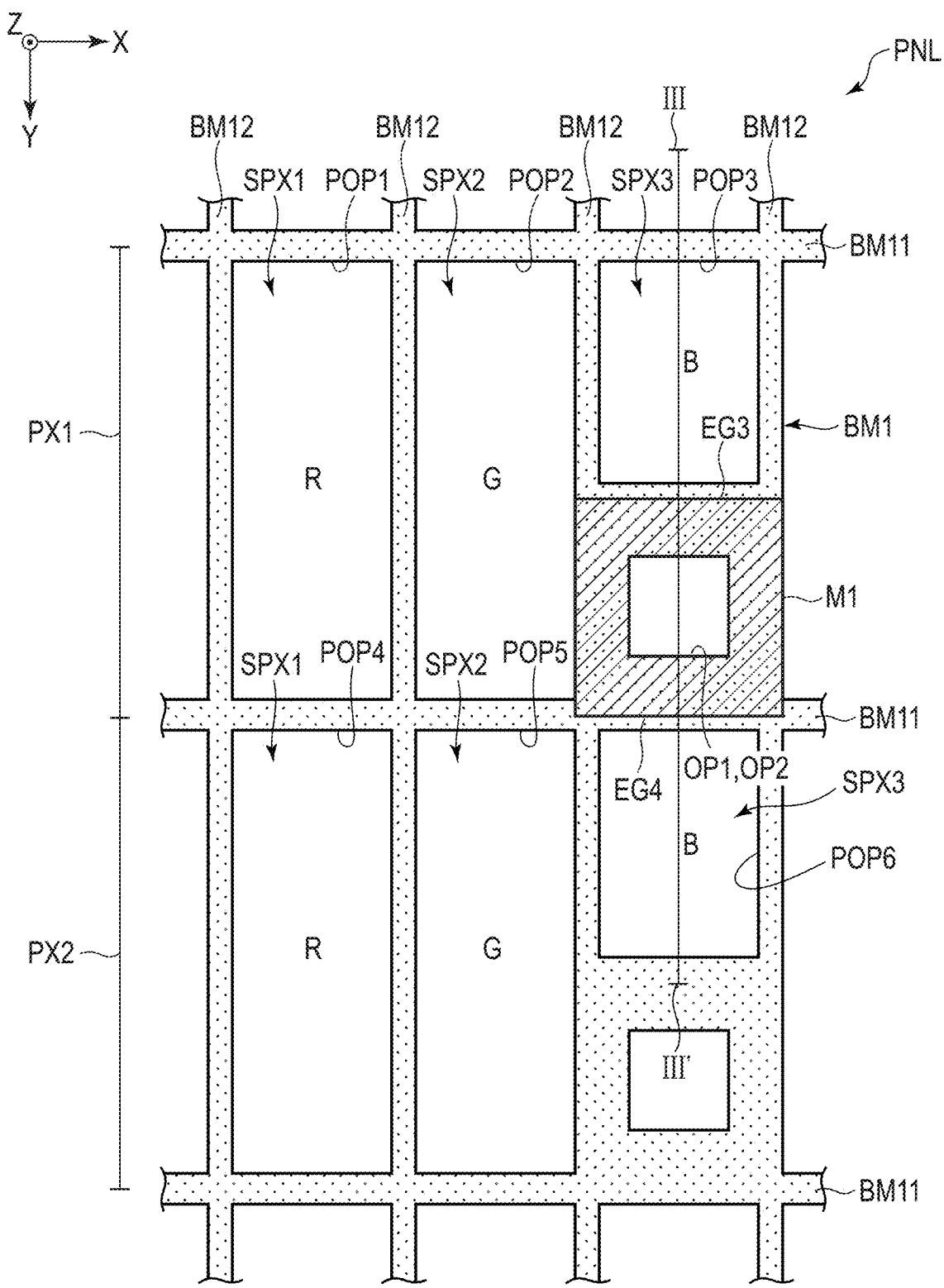
FIG. 7 is a plan view illustrating the first metal layer and the light shielding layer disposed in a pixel.

FIG. 7 is a plan view illustrating a first metal layer M1 and a light shielding layer BM1 disposed in pixels PX1 and PX2. In FIG. 7, the area where the first metal layer M1 is disposed is hatched. The first metal layer M1 overlaps the light shielding layer BM1.

Here, the pixel opening POP3, second opening OP2, and pixel opening POP6 are focused. In the second direction Y, the second opening OP2 is positioned between the pixel opening POP3 and the pixel opening POP6. The first metal layer M1 includes an outer edge (third edge) EG3 and an outer edge (fourth edge) EG4 extending in the first direction X. The outer edge EG3 overlaps the light shielding layer BM1 between the second opening OP2 and the pixel opening POP3 in a plan view. The outer edge EG4 overlaps the light shielding layer BM1 between the second opening OP2 and the pixel opening POP6 in a plan view.

Figure 8:
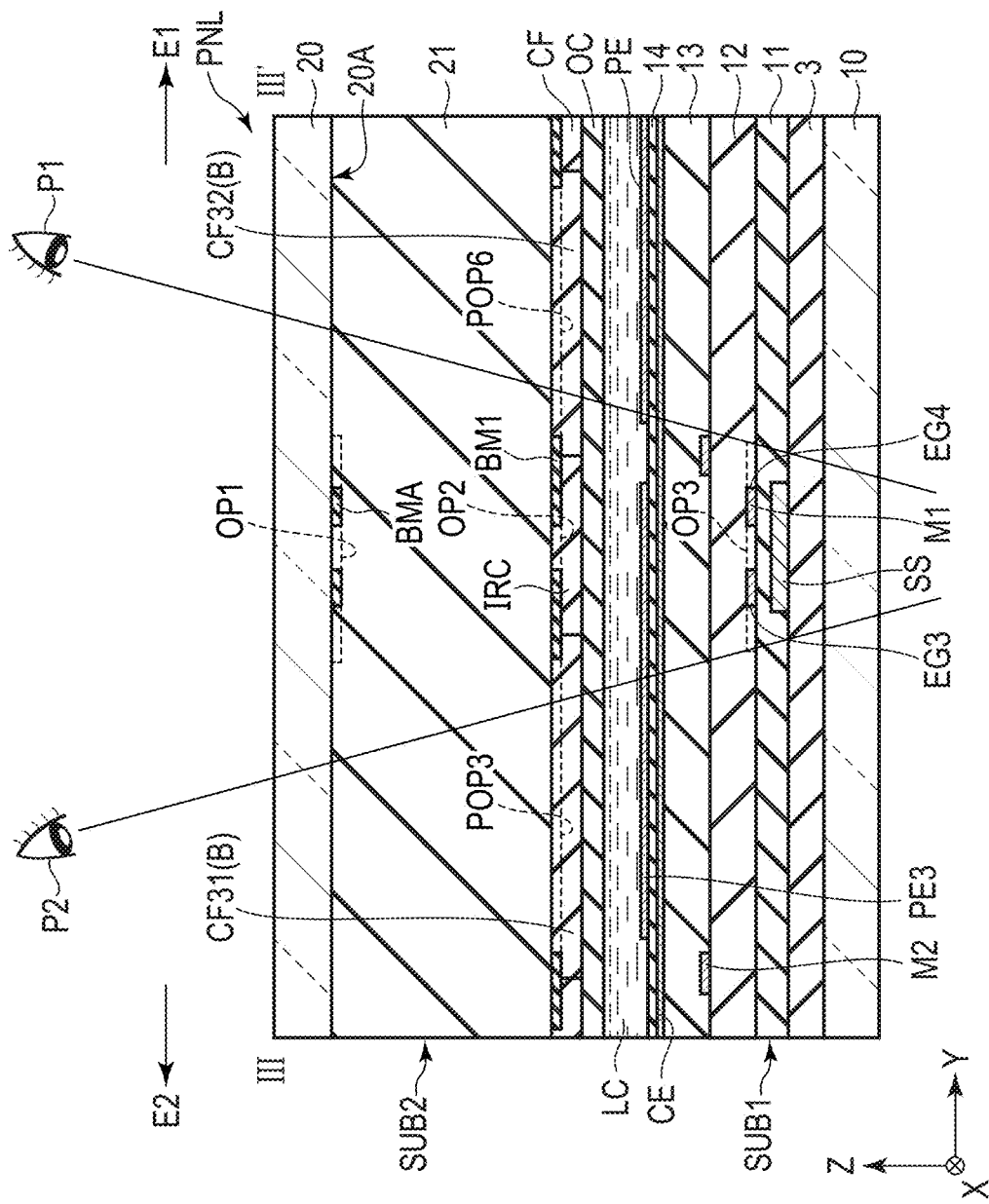
FIG. 8 is a cross-sectional view of the display panel of FIG. 7, taken along line III-III'.

FIG. 8 is a cross-sectional view of the display panel PNL of FIG. 7, taken along line III-III'.

The edges EG3 and EG4 of the first metal layer M1 overlap an infrared cut layer IRC. The outer edge EG3 does not overlap a color filter CF31, and the outer edge EG4 does not overlap a color filter CF32.

Now, advantages obtainable by the present embodiment will be explained.

Initially, a case where the first metal layer M1 is formed to a position of dotted lines in the periphery of the first metal layer M1 of FIG. 8 is hypothetically given.

When observing the display panel PNL from an observation point P1, light passing through the color filter CF32 of blue (B) is blocked by the first metal layer M1. Thereby, the display light observed at the observation point P1 may be tinted closer to a yellow wavelength, for example. Furthermore, when observing the display panel PNL from an observation point P2, light passing through the color filter CF31 of blue (B) is blocked by the first metal layer M1. Thereby, the display light observed at the observation point P2 may be tinted closer to a yellow wavelength, for example.

According to the second embodiment, the outer edge EG3 of the first metal layer M1 is positioned between the second opening OP2 and the pixel opening POP3, and the outer edge EG4 of the first metal layer M1 is positioned between the second opening OP2 and the pixel opening POP6. Thus, the light toward the diagonal field of view is not blocked by the first metal layer M1, and undesirable tint in the display light can be suppressed.

Figure 9:
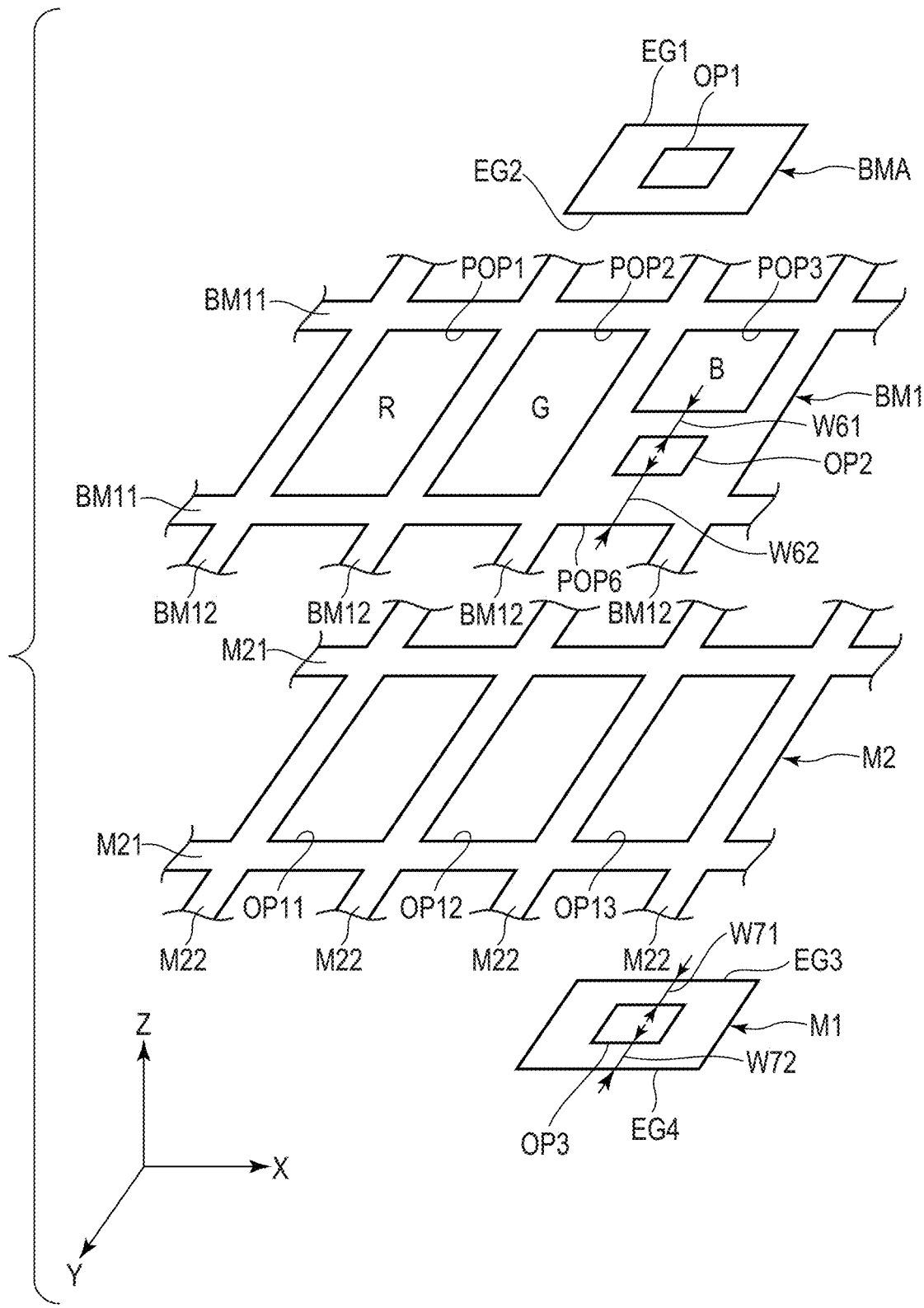
FIG. 9 is a perspective view illustrating a relationship between a first light shielding member, light shielding layer, first metal layer, and second metal layer of a second embodiment.

FIG. 9 is a perspective view illustrating a relationship between the first light shielding member BMA, light shielding layer BM1, first metal layer M1, and second metal layer M2 of the second embodiment. The first light shielding member BMA, light shielding layer BM1, and second metal layer M2 of FIG. 9 are structured similarly to those of FIG. 6.

The first metal layer M1 has a width W71 between the third opening OP3 and the outer edge EG3, and a width W72 between the third opening OP3 and the outer edge EG4. The light shielding layer BM1 has widths W61 and W62 as in FIG. 6. The width W71 is less than the width W61. Furthermore, the width W72 is less than the width W62.

Third Embodiment

Now, the structure of the third embodiment will be explained with reference to FIGS. 10 to 13. The third embodiment differs from the first embodiment in respect of including a second light shielding member BMB.

FIG. 10 is a plan view illustrating a first light shielding member BMA, second light shielding member BMB, and light shielding layer BM1 arranged in pixels PX1 and PX2. In FIG. 10, the area where the first light shielding member BMA and the second shielding member BMB are disposed is hatched.

The display panel PNL includes a band-shaped second light shielding member BMB extending in the first direction X. The second light shielding member BMB overlaps the light shielding layer BM1. The first light shielding member BMA and the second light shielding member BMB are aligned in the first direction X. The second light shielding member BMB is positioned, in a plan view, between a pixel opening POP2 and a pixel opening POP5, and between a pixel opening POP1 and a pixel opening POP4.

Note that, in the example depicted, the second light shielding member BMB is formed continuously to the first light shielding member BMA; however, it may be formed separately from the first light shielding member BMA.

The first light shielding member BMA of the third embodiment has a width in the second direction Y which is not formed as small as in the first and second embodiments. The light shielding layer BM1 includes an inner edge IE1 facing the pixel opening POP3 and an inner edge IE2 facing the pixel opening POP6. The inner edge IE1 is positioned in the second opening OP2 side with respect to the pixel opening POP3. The inner edge IE2 is positioned in the second opening OP2 side with respect to the pixel opening POP6. The inner edges IE1 and IE2 extend in the first direction X. The outer edge EG1 of the first light shielding member BMA overlaps, for example, the inner edge IE1. The outer edge EG2 of the first light shielding member BMA overlaps, for example, the inner edge IE2.

Figure 11:
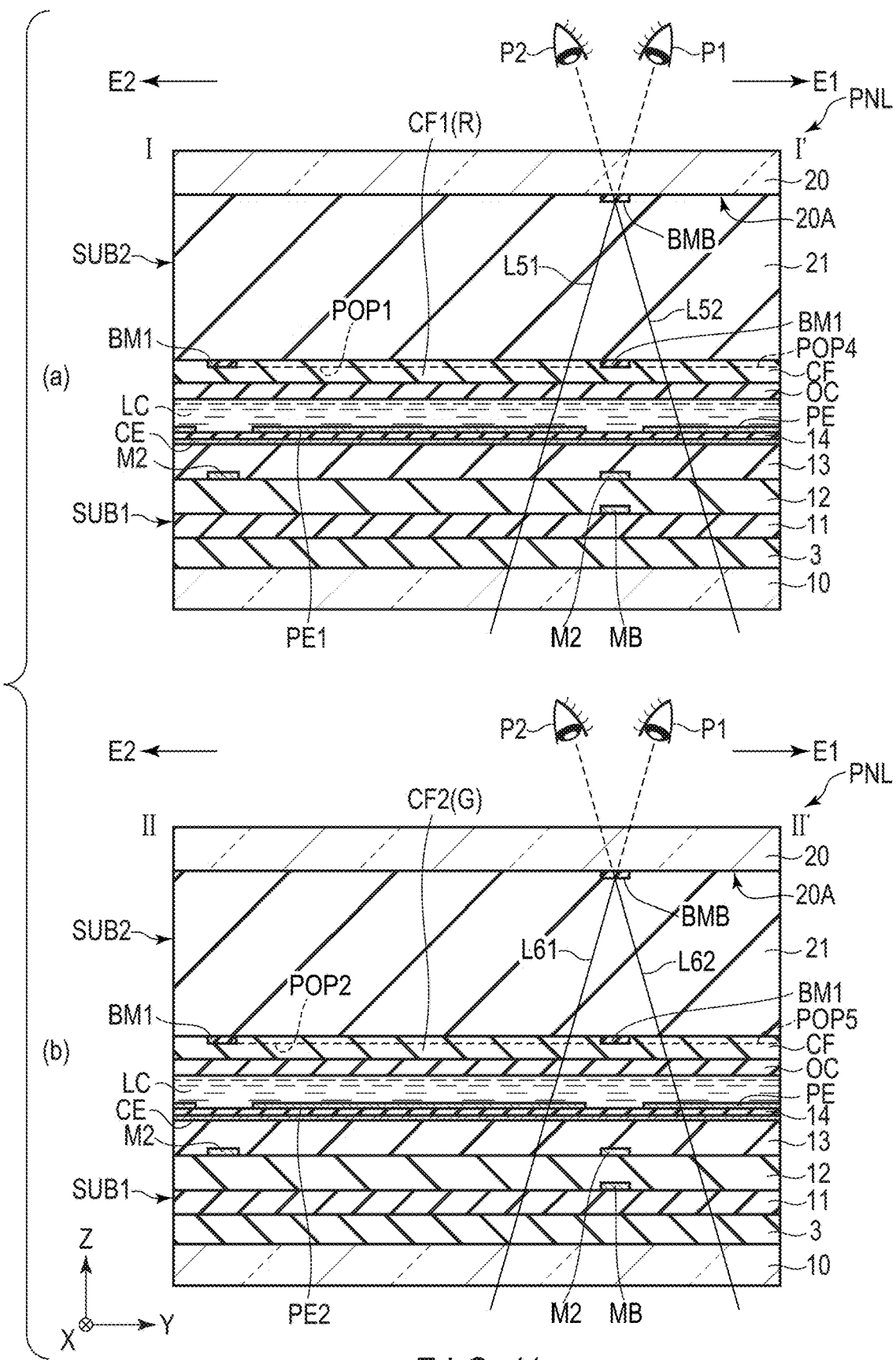
FIG. 11 is a cross-sectional view of a display panel of FIG. 10.

FIG. 11 is a cross-sectional view of the display panel of FIG. 10. FIG. 11(a) is a cross-sectional view of the display panel PNL, taken along line I-I' of FIG. 10. FIG. 11(b) is a cross-sectional view of the display panel PNL, taken along line II-II' of FIG. 10. Furthermore, FIG. 12 is a cross-sectional view of the display panel PNL, taken along line III-III' of FIG. 10.

The second substrate SUB2 includes a second light shielding member BMB. The second light shielding member BMB is positioned in the insulating substrate 20 in the liquid crystal layer LC side. In the example depicted, the second light shielding member BMB positioned in the surface 20A. The second light shielding member BMB is formed of the same material as with the first light shielding member BMA, and is formed of a black resin, for example. The organic insulating layer 21 convers the first light shielding member BMA and the second light shielding member BMB.

Now, advantages obtainable by the present embodiment will be explained.

Figure 12:
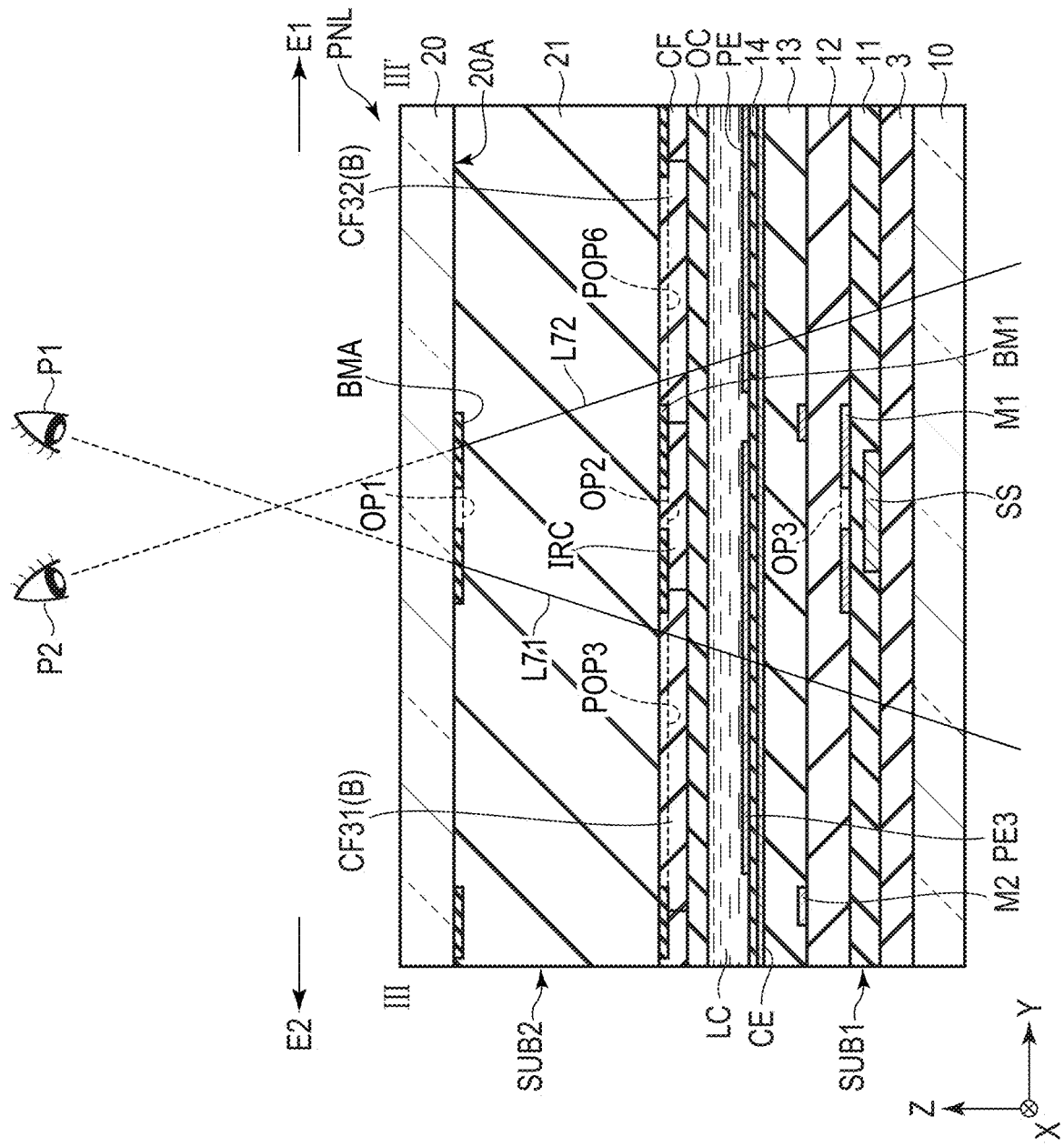
FIG. 12 is a cross-sectional view of the display panel of FIG. 10, taken along line III-III'.

As in FIG. 12, when observing the display panel PNL from an observation point P1, light L71 passing through a color filter CF31 of blue (B) is blocked by the first light shielding member BMA. Thereby, the display light observed at the observation point P1 may be tinted closer to a yellow wavelength, for example.

In the third embodiment, as in FIG. 11(a), the second light shielding member BMB overlaps between a pixel opening POP1 and a pixel opening POP4. Thus, when observing the display panel PNL from the observation point P1, light L51 passing through a color filter CF1 of red (R) is also blocked by the second light shielding member BMB. Furthermore, as in FIG. 11(b), the second light shielding member BMB overlaps between a pixel opening POP2 and a pixel opening POP5. Thereby, when observing the display panel PNL from the observation point P1, light L61 passing through a color filter CF2 of green (G) is also blocked by the second light shielding member BMB.

Red light L51 and green light L61 are reduced with respect to reduced blue light L71, and thus, the display color can be balanced. Thus, a tint of the display light can be reduced.

Furthermore, as in FIG. 12, when observing the display panel PNL from an observation point P2, light L72 passing through a color filter CF32 of blue (B) is blocked by the first light shielding member BMB. Thereby, the display light observed at the observation point P2 may be tinted closer to a yellow wavelength, for example.

In the third embodiment, as in FIG. 11(a), the second light shielding member BMB overlaps between the pixel opening POP1 and the pixel opening POP4. Thus, when observing the display panel PNL from the observation point P2, light L52 passing through a color filter CF1 of red (R) is also blocked by the second light shielding member BMB. Furthermore, as in FIG. 11(b), the second light shielding member BMB overlaps between the pixel opening POP2 and the pixel opening POP5. Thereby, when observing the display panel PNL from the observation point P2, light L62 passing through a color filter CF2 of green (G) is also blocked by the second light shielding member BMB.

Red light L52 and green light L62 are reduced with respect to reduced blue light L72, and thus, the display color can be balanced. Thus, a tint of the display light can be reduced.

Figure 13:
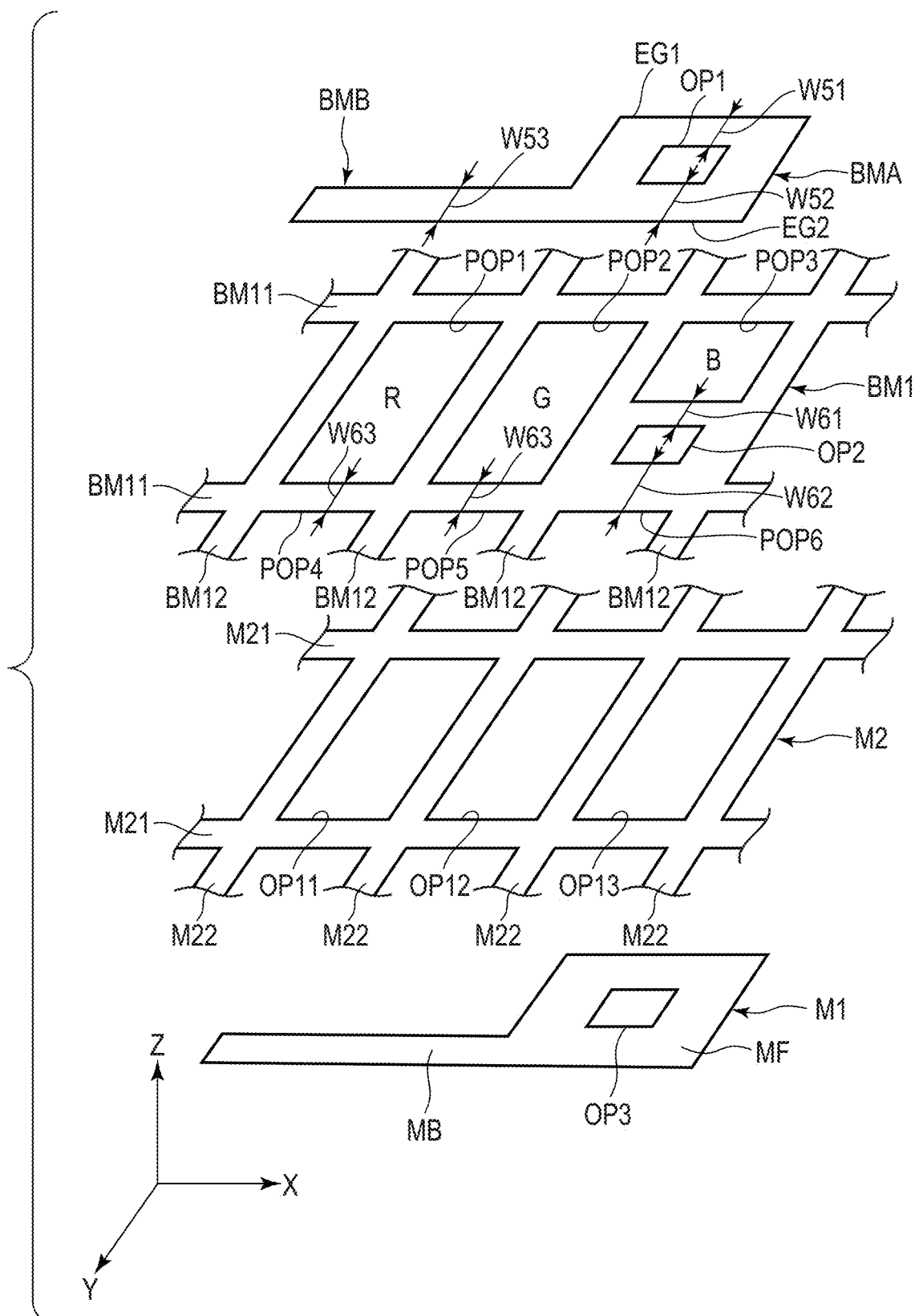
FIG. 13 is a perspective view illustrating a relationship between a first light shielding member, second light shielding member, light shielding layer, first metal layer, and second metal layer of a third embodiment.

FIG. 13 is a perspective view illustrating a relationship between the first light shielding member BMA, second light shielding member BMB, light shielding layer BM1, first metal layer M1, and second metal layer M2 of the second embodiment. The light shielding layer BM1, and the second metal layer M2 of FIG. 13 are structured similarly to those of FIG. 6.

The first light shielding member BMA has a width W51 and a width W52 as in FIG. 6. The light shielding layer BM1 has a width W61 and a width W62 as in FIG. 6. In the third embodiment, for example, the width W51 and the width W61 are equal, and the width W52 and the width W62 are equal. Furthermore, the second light shielding member BMB has a width W53 in the second direction Y. A first part BM11 between the pixel opening POP2 and the pixel opening POP5 has a width W63 in the second direction Y. For example, the width W53 and the width W63 are equal. Note that, the first part BM11 has the width W63 in the second direction Y between the pixel opening POP1 and the pixel opening POP4.

The first metal layer M1 includes a frame-like portion MF and a band-like portion MB aligned in the first direction X. The frame-like portion MF includes a third opening OP3, and is formed in a frame shape. The band-like portion MB extends in the first direction X. As in FIG. 11, the band-like portion MB overlaps the second light shielding member BMB. Thus, when observing the display panel PNL from the observation points P1 and P2, light passing through the color filter CF1 of red (R) is blocked, and light passing through the color filter CF2 of green (G) is blocked. With the band-like portion MB, the display color can be balanced as with the second light shielding member BMB. Thus, a tint of the display light can be reduced.

Fourth Embodiment

Now, the structure of the fourth embodiment will be explained with reference to FIGS. 14 to 16. The fourth embodiment differs from the first embodiment in respect of a different layout of a first opening OP1 and a second opening OP2.

Figure 14:
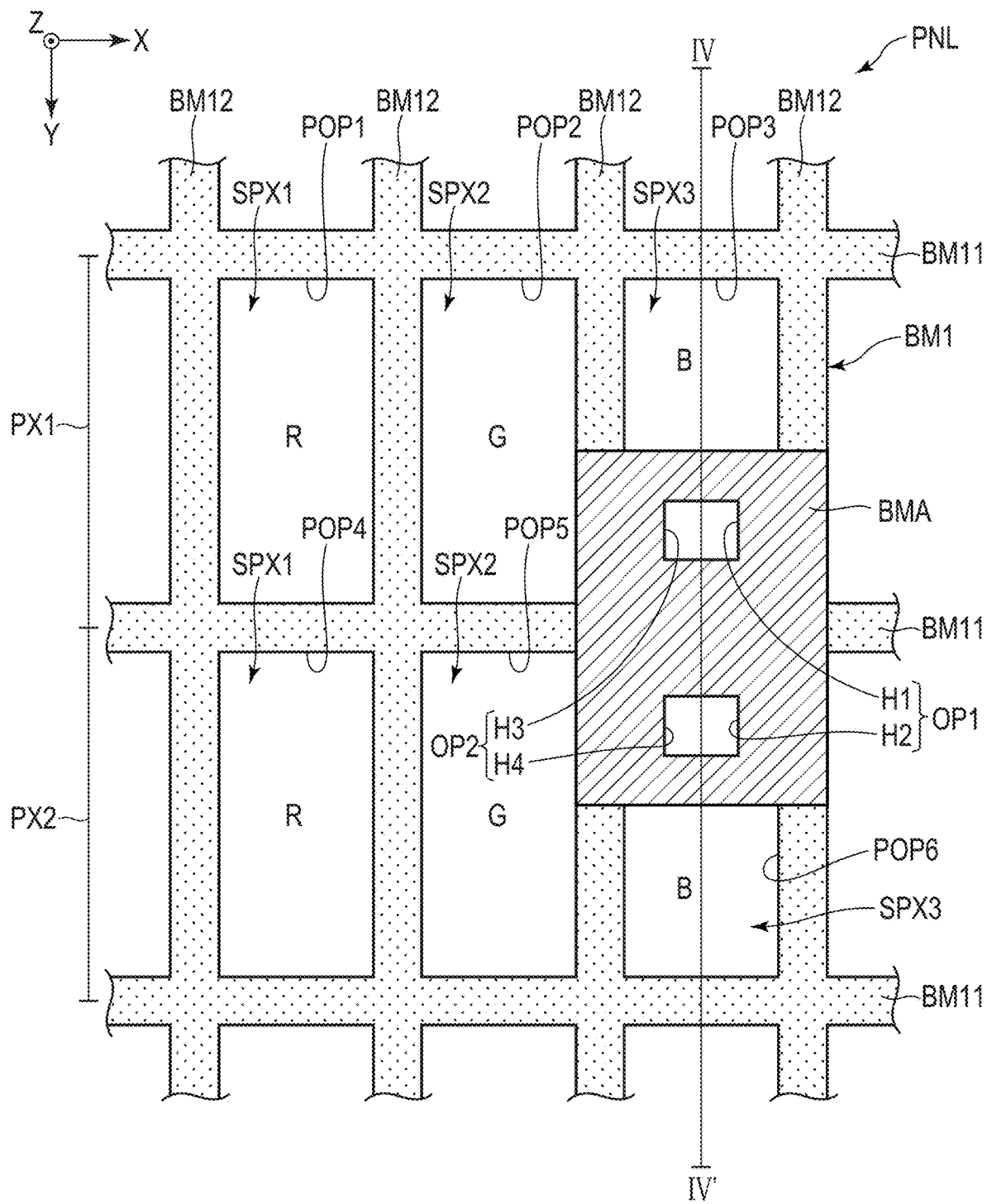
FIG. 14 is a plan view illustrating the first light shielding member and the light shielding layer arranged in a pixel.

FIG. 14 is a plan view illustrating a first light shielding member BMA and a light shielding layer BM1 arranged in pixels PX1 and PX2. In FIG. 14, the area where the first light shielding member BMA is disposed is hatched.

The first opening OP1 includes a first hole positioned in the pixel PX1 and a second hole positioned in the pixel PX2. The second opening OP2 includes a third hole H3 positioned in the pixel PX1 and a fourth hole H4 positioned in the pixel PX2. The third hole H3 overlaps the first hole H1. The fourth hole H4 overlaps the second hole H2. A pixel opening POP3, third hole H3, fourth hole H4, and pixel opening POP6 are aligned in the second direction Y. A pixel opening POP2 is aligned with the pixel opening POP3 and the third hole H3 in the first direction X. A pixel opening POP5 is aligned with the pixel opening POP6 and the hole H4 in the first direction X.

Figure 15:
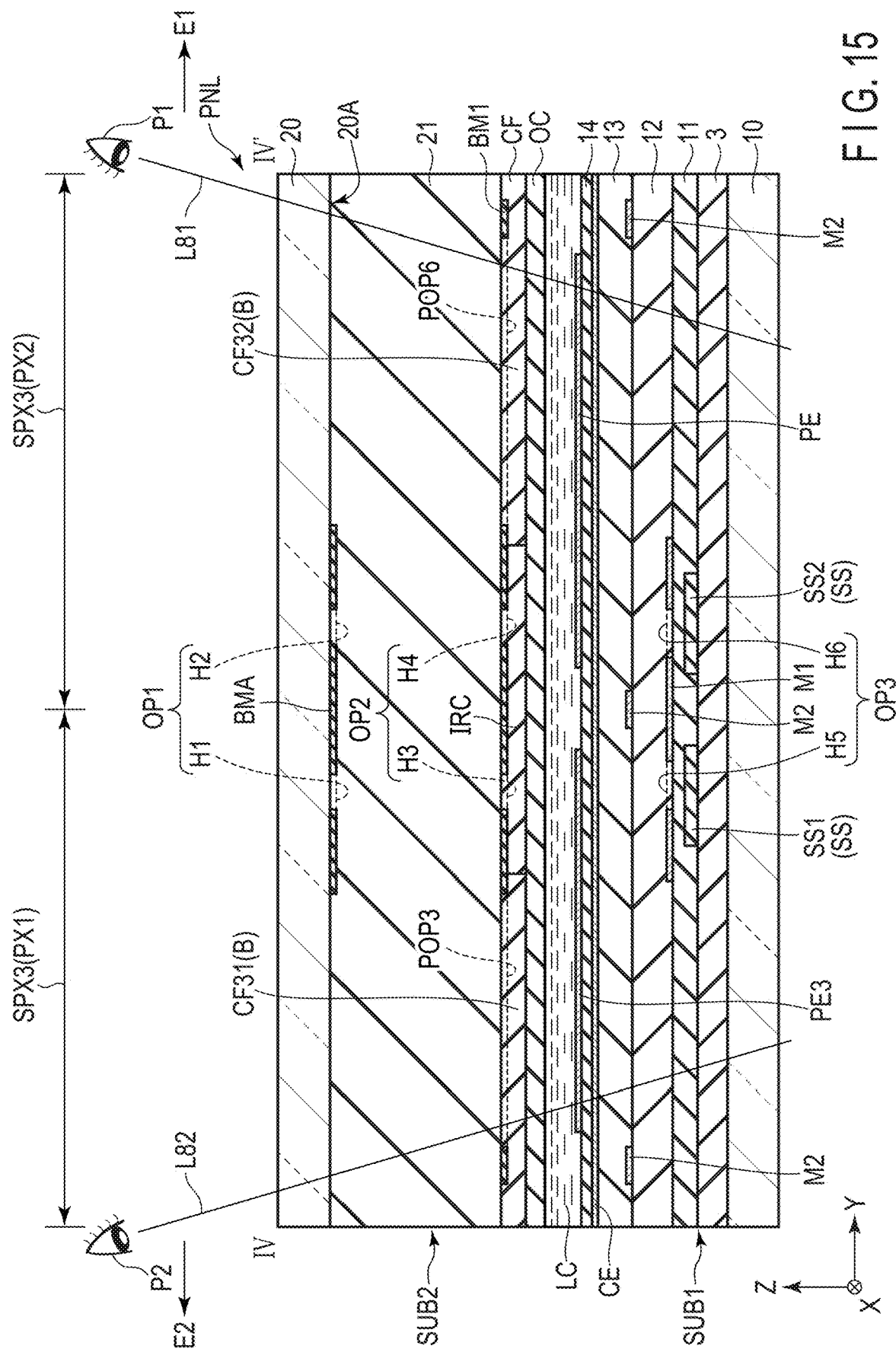
FIG. 15 is a cross-sectional view of the display panel of FIG. 14, taken along line IV-IV'.

FIG. 15 is a cross-sectional view of the display panel PNL, taken along line IV-IV' of FIG. 14.

The first substrate SUB1 includes a first optical sensor SS1 and a second optical sensor SS2 as optical sensors. The first hole H1 and the third hole H3 overlap the first optical sensor SS1. The second hole H2 and the fourth hole H4 overlap the second optical sensor SS2. The infrared cut layer IRC is disposed in the third hole H3 and the fourth hole H4. The first metal layer M1 is disposed further in the liquid crystal layer LC side than are the first optical sensor SS1 and the second optical sensor SS2. The third opening OP3 of the first metal layer M1 includes a fifth hole H5 overlapping the first hole H1 and the third hole H3, and a sixth hole H6 overlapping the second hole H2 and the fourth hole H4.

Now, advantages obtainable by the present embodiment will be explained.

In the fourth embodiment, the first optical sensor SS1 of the pixel PX1 and the second optical sensor SS2 of the pixel PX2 are positioned between the pixel opening POP3 and the pixel opening POP6. Thus, in a subpixel SPX3 of the pixel PX2, the first light shielding member BMA is positioned in one end side but not in the other end side. Thus, when observing the display panel PNL from an observation point P1, light L81 passing through a color filter CF32 of blue (B) is not blocked by the first light shielding member BMA in the other end side of the subpixel SPX3. Similarly, in the subpixel SPX3 of the pixel PX1, the first light shielding member BMA is positioned in one end side but not in the other end side. Thus, when observing the display panel PNL from an observation point P2, light L82 passing through the color filter CF31 of blue (B) is not blocked by the first light shielding member BMA in the other end side of the subpixel SPX3.

Thus, light in the diagonal field of view is not blocked by the first light shielding member BMA, and an undesirable tint of the display light can be reduced.

Figure 16:
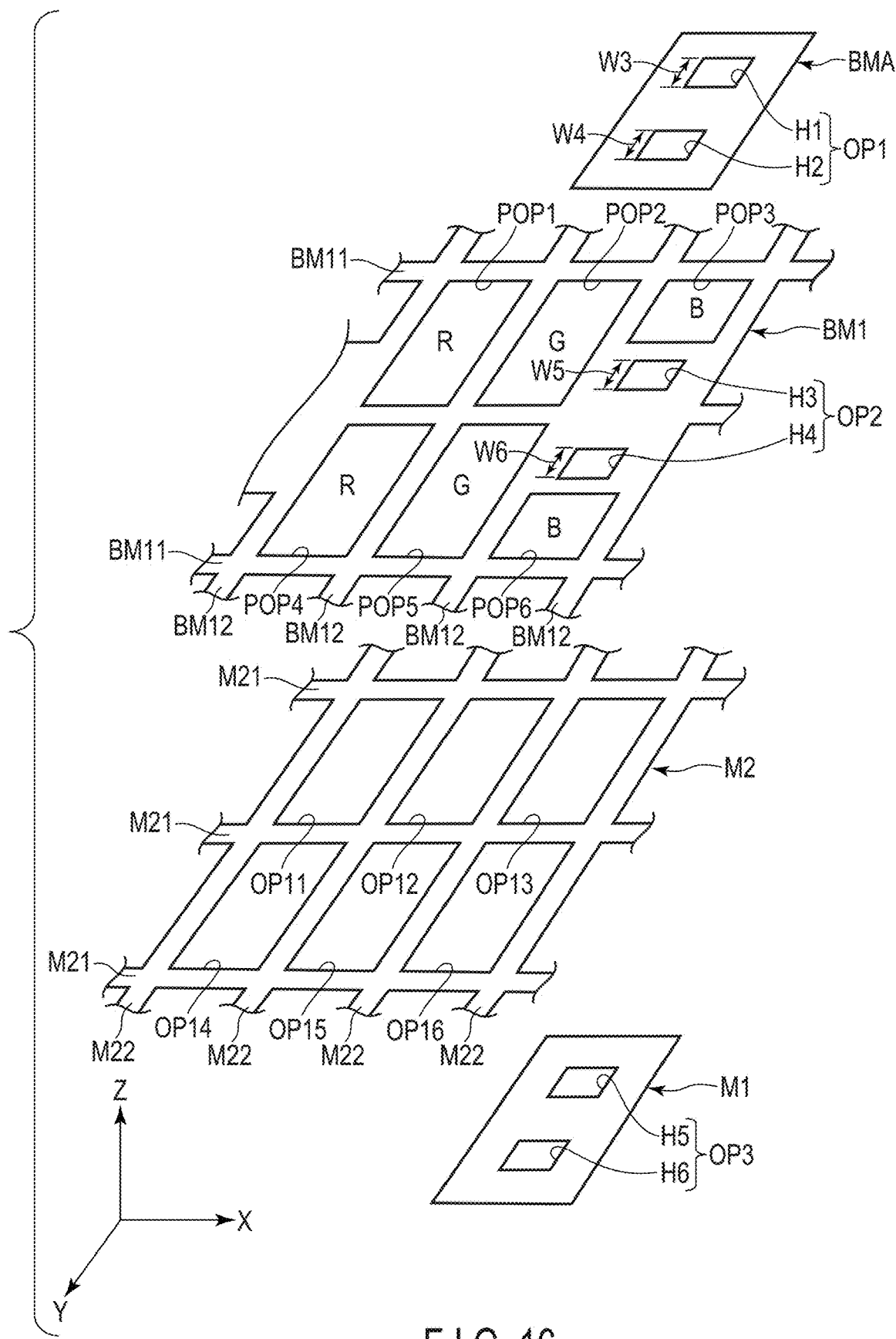
FIG. 16 is a perspective view illustrating a relationship between a first light shielding member, light shielding layer, first metal layer, and second metal layer of a fourth embodiment.

FIG. 16 is a perspective view illustrating a relationship between the first light shielding member BMA, light shielding layer BM1, first metal layer M1, and second metal layer M2 of the fourth embodiment.

The first hole H1 has a width W3 along the second direction Y. The second hole H2 has a width W4 along the second direction Y. The third hole H3 has a width W5 along the second direction Y. The hole H4 has a width W6 along the second direction Y. For example, the widths W3 and W5 are equal. Furthermore, for example, the widths W4 and W6 are equal.

The second metal layer M2 includes a plurality of openings OP11 to OP16 defined by the first parts M21 and the second parts M22. The opening OP13 overlaps the pixel opening POP3 and the third hole H3. The opening OP14 overlaps the pixel opening POP4. The opening OP15 overlaps the pixel opening POP5. The opening OP16 overlaps the pixel opening POP6 and the fourth hole H4.

Note that, in the fourth embodiment, a second light shielding member BMB of the third embodiment may be formed. In that case, the second light shielding member BMB is formed smaller in the first direction X and the second direction Y as compared to that of the third embodiment.

Now, detailed structures of the optical sensor SS, pixel PX1, and the like will be explained with reference to FIGS. 17 to 19.

Figure 17:
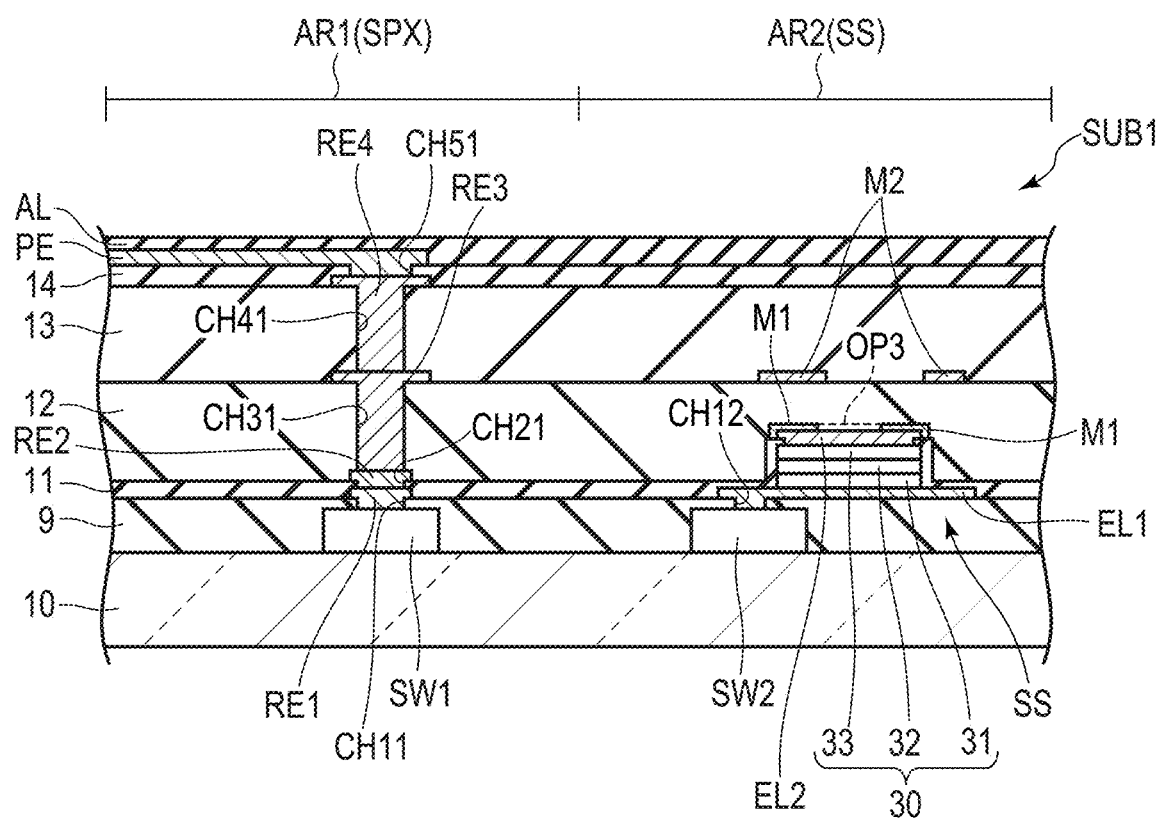
FIG. 17 is a cross-sectional view of the first substrate, illustrating detailed layered structure in a first area where subpixels are positioned and a second area where optical sensors are positioned.

FIG. 17 is a cross-sectional view illustrating a detailed layered structure of the first substrate SUB1 in a first area AR1 where a subpixel SPX is positioned and a second area AR2 where an optical sensor SS is positioned.

Initially, the layered structure of the first area AR1 will be explained.

A switching element SW1 is positioned above an insulating substrate 10. An insulating layer 9 covers the switching element SW1. A relay electrode RE1 is positioned above the insulating layer 9. The relay electrode RE1 is connected to the switching element SW1 through a contact hole CH11 formed in the insulating layer 9. An insulating layer 11 covers the relay electrode RE1. A relay electrode RE2 is positioned above the insulating layer 11. The relay electrode RE2 is connected to the relay electrode RE1 through a contact hole CH21 formed in the insulating layer 11.

An insulating layer 12 covers the relay electrode RE2. A relay electrode RE3 is positioned above the insulating layer 12. A relay electrode RE3 is connected to the relay electrode RE2 through a contact hole H31 formed in the insulating layer 12. The insulating layer 13 covers the relay electrode RE3. The relay electrode RE4 is positioned above the insulating layer 13. A relay electrode RE4 is connected to the relay electrode RE3 through a contact hole CH41 formed in the insulating layer 13.

An insulating layer 14 covers the relay electrode RE4. The pixel electrode PE is positioned above the insulating layer 14. The pixel electrode PE is connected to the relay electrode RE4 through a contact hole CH51 formed in the insulating layer 14. An alignment film AL covers the pixel electrode PE and the insulating layer 14. Note that the relay electrode RE4 and the aforementioned common electrode CE are positioned in the same layer between the insulating layer 13 and the insulating layer 14.

Now, the layered structure of the second area AR2 will be explained.

The switching elements SW2 is positioned above the insulating substrate 10. The insulating layer 9 covers the insulating element SW2. The optical sensor SS includes a lower electrode EL1, photoelectric conversion element 30 overlapping the lower electrode EL1, and upper electrode (transparent electrode) EL2 overlapping the photoelectric conversion element 30. The lower electrode EL1 is positioned above the insulating layer 9. The lower electrode EL1 is connected to the switching element SW2 through a contact hole CH12 formed in the insulating layer 9. The lower electrode EL1 is formed of a non-transparent metal material. That is, the lower electrode EL1 functions as a light shielding layer with respect to the photoelectric conversion element 30 to suppress intrusion of light transmitting the insulating substrate 10 into the photoelectric conversion element 30. Note that, the lower electrode EL1 and the relay electrode RE1 are positioned in the same layer between the insulating layer 9 and the insulating layer 11.

The photoelectric conversion element 30 is a photodiode which outputs an electric signal corresponding to irradiated light. Specifically, the photoelectric conversion element 30 is a positive intrinsic negative (PIN) photodiode.

The photoelectric conversion element 30 includes a p-type semiconductor layer 31, i-type semiconductor layer 32, and n-type semiconductor layer 33. The p-type semiconductor layer 31, i-type semiconductor layer 32, and n-type semiconductor layer 33 are layered in the order stated. Note that, the order may be the n-type semiconductor layer 33, i-type semiconductor layer 32, and p-type semiconductor layer 31. The p-type semiconductor layer 31 is formed of, for example, polycrystalline silicon, and the i-type semiconductor layer 32 and the n-type semiconductor layer 33 are formed of, for example, amorphous silicon (a-Si). Note that, the materials of the semiconductor layers are not limited to the above examples, and amorphous silicon may be replaced with polycrystalline silicon, microcrystalline silicon, or the like, and polycrystalline silicon may be replaced with amorphous silicon, microcrystalline silicon, or the like.

The insulating layer 11 covers the lower electrode EL1 and the photoelectric conversion element 30. The upper electrode EL2 is positioned in the optical sensor SS in the light receiving side, and is electrically connected to the n-type semiconductor layer 33. The upper electrode EL2 is a transparent electrode formed of a transparent conductive material such as ITO. The first metal layer M1 is disposed above the upper electrode EL2 contacting the upper electrode LE2. The third opening OP3 of the first metal layer M1 is formed in a position overlapping the lower electrode EL1, photoelectric conversion element 30, and upper electrode EL2. The insulating layer 12 covers the first metal layer M1. The second metal layer M2 is positioned above the insulating layer 12. Note that, the first metal layer M1 and the relay electrode RE2 are positioned in the same layer between the insulating layer 11 and the insulating layer 12. The second metal layer M2 and the relay electrode RE3 are positioned in the same layer between the insulating layer 12 and the insulating layer 13. Furthermore, the switching elements SW1 and SW2, the insulating layer 9, and the like are included in the aforementioned configuration layer 3.

Figure 18:
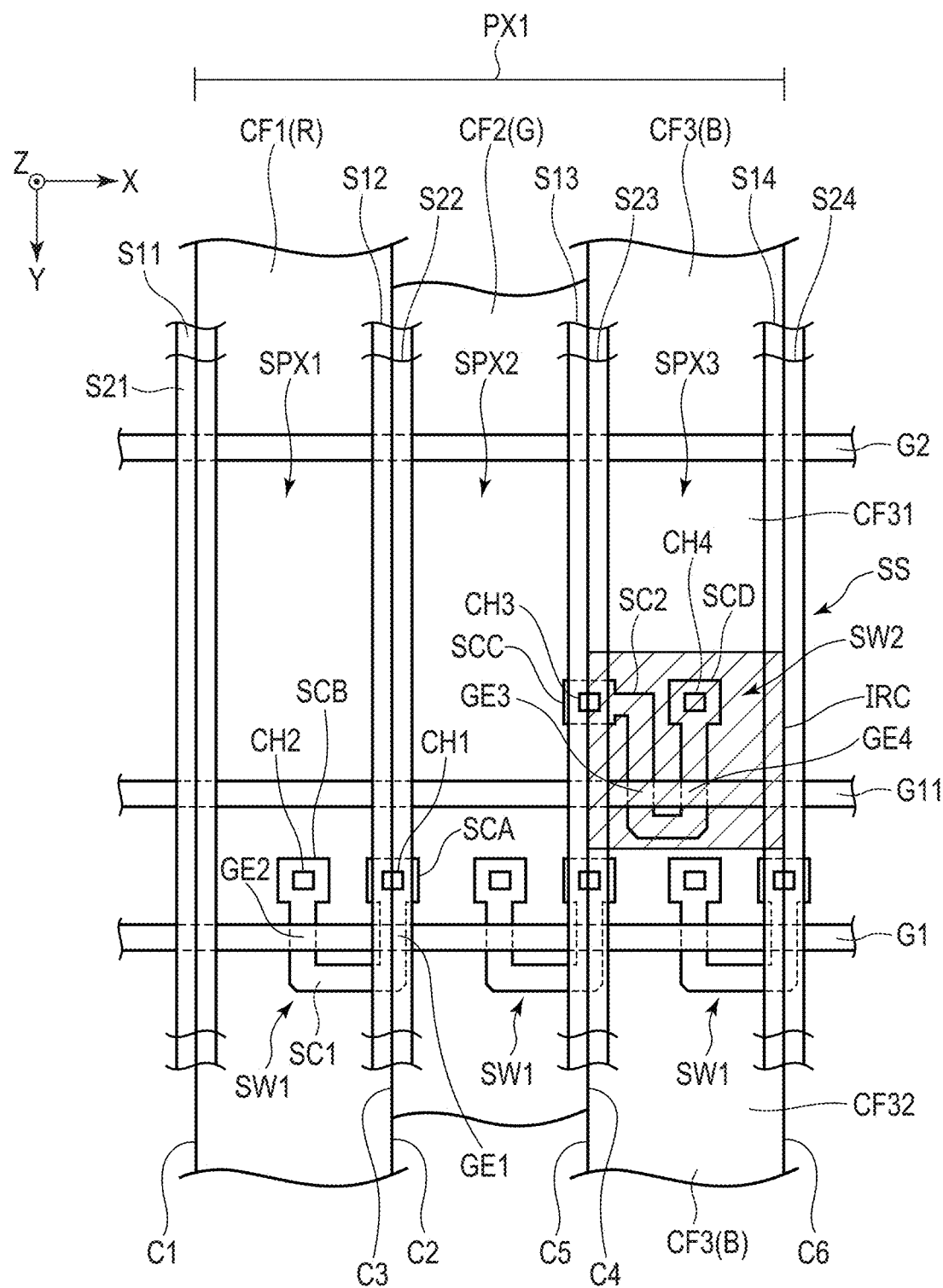
FIG. 18 is a plan view illustrating a pixel.

FIG. 18 is a plan view illustrating the pixel PX1.

Source lines S11 to S14 extend in the second direction Y and are aligned in the first direction X. Source liens S21 to S24 extend in the second direction Y and are aligned in the first direction X. The source lines S21 to S24 overlap the source lines S11 to S14, respectively. Gate lines G1, G11, and 2 extend in the first direction X and are aligned in the second direction Y. Note that, the gate lines G1 and G2 overlap the first part BM11 of the light shielding layer BM1 and the first part M21 of the second metal layer M2. Furthermore, the source lines S11 to S14 and the source lines S21 to S24 overlap the second part BM12 of the light shielding layer BM1 and the second part M22 of the second metal layer M2.

The color filters CF1, CF2, and CF3 extend in the second direction Y and are aligned in the first direction X. The color filter CF3 includes the aforementioned color filters CF31 and CF32. The color filter CF1 includes ends C1 and C2 extending in the second direction Y. The color filter CF2 includes ends C3 and C4 extending in the second direction Y. The color filter CF3 includes ends C5 and C6 extending in the second direction Y. The end C1 overlaps the source lines S11 and S21, the ends C2 and C3 overlap the source lines S12 and S24, the ends C4 and C5 overlap the source lines S13 and S23, and the end C6 overlaps the source lines S14 and S24. Note that, the ends C1 to C6 further overlaps the second part BM12 of the light shielding layer BM1 and the second part M22 of the second metal layer M2.

With the second parts M22 of the second metal layer M2 overlapping the ends C1 to C6, when observing the display panel PNL from an angle greater than a certain angle with respect to the third direction Z, a mixed color phenomenon in which light beams passing through color filters of pixels adjacent to the pixels turned on are mixed can be suppressed.

The color filter CF3 is not disposed in a position overlapping the gate line G11. At the position overlapping the gate line G11, the infrared cut layer IRC is disposed. In FIG. 18, the area where the infrared cut layer IRC is disposed is hatched. The infrared cut layer IRC is positioned between two color filters CF31 and CF32 aligned in the second direction Y.

Now, the structure of the switching element SW1 of the subpixel SPX1 will be explained. Note that, the structure of the switching element SW1 of subpixels SPX2 and SPX3 is the same as that of the switching element SW1 of the subpixel SPX1.

The switching element SW1 includes gate electrodes GE1 and GE2 and a semiconductor layer SC1. The semiconductor layer SC1 is disposed to partially overlap the source line S12, and the other part thereof extends between the source lines S11 and S12, thus is formed in a substantial U-shape. The semiconductor layer SC1 crosses the gate line G1 in a position overlapping the source line S12, and also crosses the gate line G1 between the source lines S11 and S12. In the gate line G1, the area overlapping the semiconductor layer SC1 functions as gate electrodes GE1 and GE2. That is, the switching element SW1 in the example depicted has a double-gate structure. The semiconductor layer SC1 is electrically connected to the source line S12 through a contact hole CH1 in one end SCA thereof, and is electrically connected to a drain electrode which is not shown through a contact hole CH2 in the other end SCB thereof.

Now, the structure of the switching element SW2 connected to the optical sensor SS will be explained.

The switching element SW2 includes gate electrodes GE3 and GE4 and a semiconductor layer SC2. The semiconductor layer SC2 is disposed to partially overlap the source line S23, and the other part thereof extends between the source lines S23 and S24, thus is formed in a substantial U-shape. The semiconductor layer SC2 crosses the gate line G11 in two positions between the source lines S23 and S24. In the gate line G11, the area overlapping the semiconductor layer SC2 functions as gate electrodes GE3 and GE4. That is, the switching element SW2 in the example depicted has a double-gate structure. The semiconductor layer SC2 is electrically connected to the source line S23 through a contact hole CH3 in one end SCC thereof, and is electrically connected to a lower electrode through a contact hole CH4 in the other end SCD thereof. The semiconductor layers SC1 and SC2 are formed of, for example, polycrystalline silicon.

Figure 19:
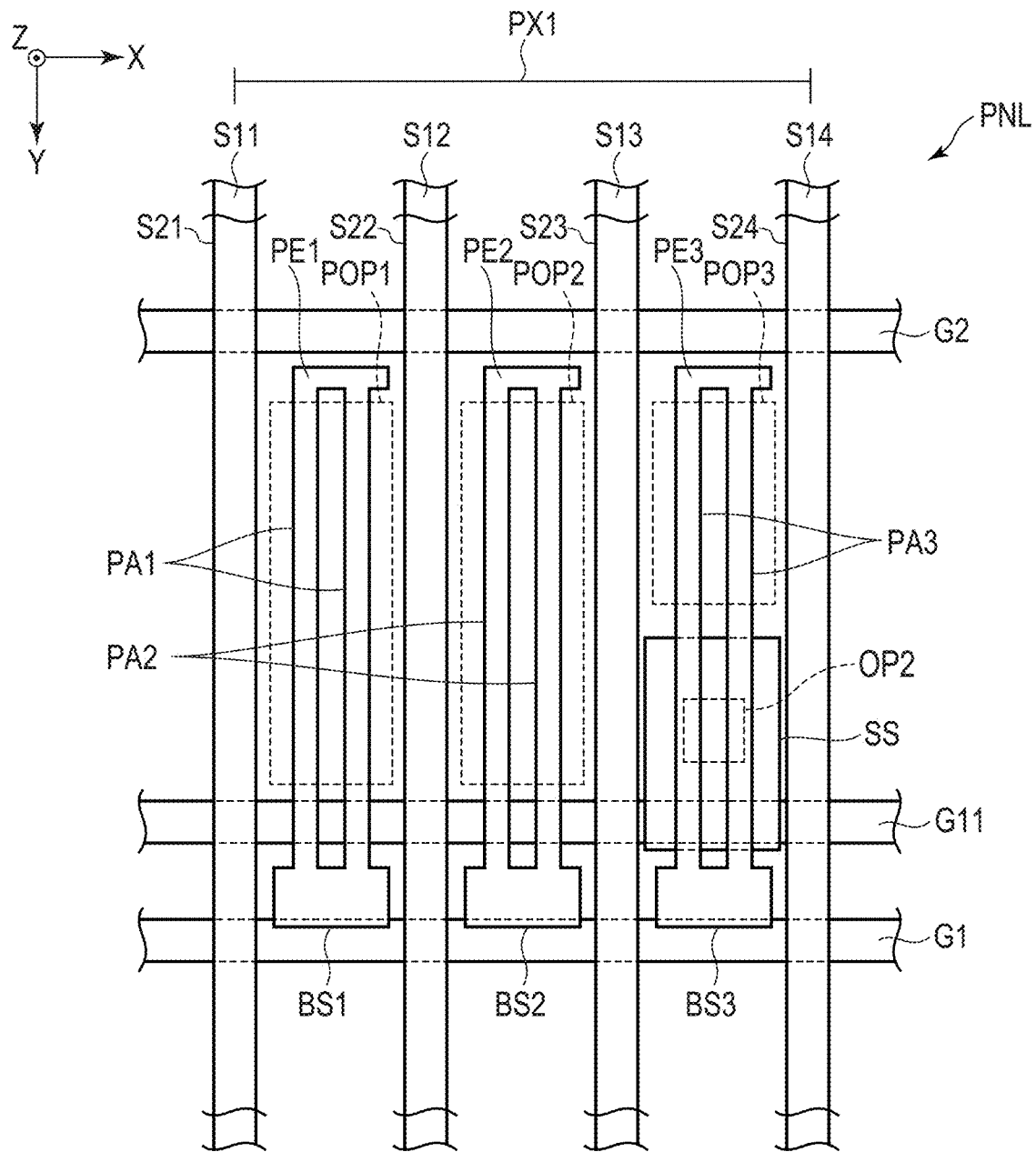
FIG. 19 is another plan view illustrating a pixel.

FIG. 19 is another plan view illustrating the pixel PX1.

Pixel electrodes PE1 to PE3 are aligned in the first direction X. The pixel electrode PE1 is positioned between the source lines S11 and S12. The pixel electrode PE2 is positioned between the source lines S12 and S13. The pixel electrode PE3 is positioned between the source lines S13 and S14. Furthermore, the pixel electrodes PE1 to PE3 are positioned between the gate line G1 and the gate line G2. The gate line G11 overlaps the pixel electrodes PE1 to PE3.

The pixel electrodes PE1 to PE3 include rectangular bases BS1 to BS3, respectively. The bases BS1 to BS3 are positioned between the gate line G1 and the gate line G11 in a plan view. Furthermore, the pixel electrodes PE1 to PE3 include band electrodes PA1 to PA3, respectively, extending in the second direction Y. The band electrodes PA1 to PA3 connect to the bases BS1 to BS3, respectively. In the example depicted, the band electrodes PA1 to PA3 are two each, but the number thereof may be one, or may be three or more.

The pixel electrode PE1 overlaps the pixel opening POP1. The pixel electrode PE2 overlaps the pixel opening POP2. The pixel electrode PE3 overlaps both the pixel opening POP3 and the optical sensor SS.

Note that, in the example depicted, the source lines S11 to S14 and S21 to S24, pixel electrodes PE1 to PE3, and the like extend in parallel in the second direction Y; however, they may extend diagonally with respect to the second direction Y.

As explained above, according to the embodiments, a display device which can suppress degradation in the display quality can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a first substrate with an optical sensor;
a second substrate opposed to the first substrate; and
a liquid crystal layer located between the first substrate and the second substrate, wherein
the second substrate includes:
an insulating substrate;
a frame-like first light shielding member located on the liquid crystal layer side from the insulating substrate and having a first opening overlapping the optical sensor;
a transparent organic insulating layer covering the first light shielding member;
a light shielding layer located on the liquid crystal layer side from the organic insulating layer and having a second opening overlapping the first opening, a first pixel opening, a second pixel opening, and a third pixel opening;
a first color filter disposed in the first pixel opening;
a second color filter disposed in the second pixel opening, and having the same color as with the first color filter; and
a third color filter disposed in the third pixel opening, and having a different color from the first color filter,
the first light shielding member includes a first outer edge and a second outer edge extending in a first direction,
the first pixel opening, the second opening, and the second pixel opening are aligned in a second direction crossing the first direction,
the third pixel opening is aligned with the first pixel opening and the second opening in the first direction,
the first outer edge overlaps with the light shielding layer between the second opening and the first pixel opening in a plan view, and
the second outer edge overlaps with the light shielding layer between the second opening and the second pixel opening in a plan view.

2. The display device of claim 1, wherein
the first outer edge does not overlap the first color filter, and
the second outer edge does not overlap the second color filter.

3. The display device of claim 1, further comprising:
an infrared cut layer disposed in the second opening.

4. The display device of claim 1, wherein
a width of the first opening along the second direction and a width of the second opening along the second direction are equal.

5. The display device of claim 1, wherein
the first substrate includes a frame-like first metal layer disposed closer to the liquid crystal layer side than is the optical sensor, and having a third opening overlapping the first opening and the second opening,
the optical sensor includes a transparent electrode positioned in a light receiving side, and
the first metal layer contacts the transparent electrode.

6. The display device of claim 5, wherein
the first metal layer includes a third outer edge and a fourth outer edge extending in the first direction,
the third outer edge overlaps the light shielding layer between the second opening and the first pixel opening in a plan view, and
the fourth outer edge overlaps the light shielding layer between the second opening and the second pixel opening in a plan view.

7. The display device of claim 5, wherein
a first thickness of the organic insulating layer is greater than a second thickness between a lower surface of the first metal layer and a lower surface of the organic insulating layer.

8. The display device of claim 5, wherein
the first substrate includes a second metal layer positioned closer to the liquid crystal layer side than is the first metal layer, and
the second metal layer includes a fourth opening between the second opening and the third opening.

9. A display device comprising:
a first substrate with an optical sensor;
a second substrate opposed to the first substrate; and
a liquid crystal layer located between the first substrate and the second substrate, wherein
the second substrate includes:
an insulating substrate;
a frame-like first light shielding member located on the liquid crystal layer side from the insulating substrate and having a first opening overlapping the optical sensor;
a band-like second light shielding member located on the liquid crystal layer side from the insulating substrate;
a transparent organic insulating layer covering the first light shielding member and the second light shielding member;
a light shielding layer located on the liquid crystal layer side from the organic insulating layer and having a second opening overlapping the first opening, a first pixel opening, a second pixel opening, a third pixel opening, a fourth pixel opening, a fifth pixel opening, and a sixth pixel opening;
a first color filter disposed in the first pixel opening;
a second color filter disposed in the second pixel opening, and having the same color as with the first color filter;
a third color filter disposed in the third pixel opening and the fourth pixel opening, and having a different color from the first color filter; and a fourth color filter disposed in the fifth pixel opening and the sixth pixel opening, and having a different color from the first color filter and the third color filter, the fifth pixel opening, the third pixel opening, and the first pixel opening are aligned in a first direction, the first pixel opening, the second opening, and the second pixel opening are aligned in a second direction crossing the first direction, the fourth pixel opening is aligned with the third pixel opening in the second direction, the sixth pixel opening is aligned with the fifth pixel opening in the second direction, and the second light shielding member is positioned between the third pixel opening and the fourth pixel opening and between the fifth pixel opening and the sixth pixel opening in a plan view.

10. The display device of claim 9, wherein
the first substrate includes a first metal layer disposed closer to the liquid crystal layer side than is the optical sensor,
the first metal layer includes a frame-like portion with a third opening overlapping the first opening and the second opening and a band-like portion,
the optical sensor includes a transparent electrode positioned in a light receiving side,
the first metal layer contacts the transparent electrode, and
the band-like portion overlaps the second light shielding member.

11. The display device of claim 10, wherein
a first thickness of the organic insulating layer is greater than a second thickness between a lower surface of the first metal layer and a lower surface of the organic insulating layer.

12. The display device of claim 10, wherein
the first substrate includes a second metal layer positioned closer to the liquid crystal layer side than is the first metal layer, and
the second metal layer includes a fourth opening between the second opening and the third opening.

13. A display device comprising:
a first substrate with a first optical sensor and a second optical sensor;
a second substrate opposed to the first substrate; and
a liquid crystal layer located between the first substrate and the second substrate, wherein
the second substrate includes:
an insulating substrate;
a first light shielding member located on the liquid crystal layer side from the insulating substrate and having a first opening with a first hole overlapping the first optical sensor and a second hole overlapping the second optical sensor;
a transparent organic insulating layer covering the first light shielding member;
a light shielding layer located on the liquid crystal layer side from the organic insulating layer and having a second opening with a third hole overlapping the first hole and a fourth hole overlapping the second hole, a first pixel opening, a second pixel opening, and a third pixel opening;
a first color filter disposed in the first pixel opening;
a second color filter disposed in the second pixel opening, and having the same color as with the first color filter; and
a third color filter disposed in the third pixel opening, and having a different color from the first color filter,
the third pixel opening is aligned with the first pixel opening and the third hole in a first direction, and
the first pixel opening, the third hole, the fourth hole, and the second pixel opening are aligned in a second direction crossing the first direction.

14. The display device of claim 13, further comprising:
an infrared cut layer disposed in the third hole and the fourth hole.

15. The display device of claim 13, wherein
the first substrate includes a first metal layer disposed closer to the liquid crystal layer side than are the first optical sensor and the second optical sensor,
the first metal layer includes a third opening with a fifth hole overlapping the first hole and the third hole, and a sixth hole overlapping the second hole and the fourth hole,
the first optical sensor includes a transparent electrode positioned in a light receiving side, and
the first metal layer contacts the transparent electrode.

16. The display device of claim 15, wherein
a first thickness of the organic insulating layer is greater than a second thickness between a lower surface of the first metal layer and a lower surface of the organic insulating layer.

17. The display device of claim 15, wherein
the first substrate includes a second metal layer positioned closer to the liquid crystal layer side than is the first metal layer, and
the second metal layer includes a fourth opening between the second opening and the third opening.

* * * * *